(12) United States Patent
Shin et al.

(10) Patent No.: US 11,792,052 B2
(45) Date of Patent: Oct. 17, 2023

(54) SEMICONDUCTOR APPARATUS INCLUDING CALIBRATION CIRCUIT

(71) Applicant: SK hynix Inc., Icheon-si (KR)

(72) Inventors: Jung Hyun Shin, Icheon-si (KR); Yongsuk Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 73 days.

(21) Appl. No.: 17/585,308

(22) Filed: Jan. 26, 2022

(65) Prior Publication Data
US 2023/0068894 A1    Mar. 2, 2023

(30) Foreign Application Priority Data

Aug. 27, 2021    (KR) .......................... 10-2021-0113997

(51) Int. Cl.
*H04L 25/02* (2006.01)
*H01L 23/64* (2006.01)

(52) U.S. Cl.
CPC .......... *H04L 25/0278* (2013.01); *H01L 23/64* (2013.01)

(58) Field of Classification Search
None
See application file for complete search history.

(56) References Cited

U.S. PATENT DOCUMENTS

| | | | |
|---|---|---|---|
| 7,408,378 B2 | 8/2008 | Best et al. | |
| 9,563,213 B2 | 2/2017 | Addepalli et al. | |
| 10,075,165 B2 * | 9/2018 | Cho | H03K 19/0005 |
| 2005/0134303 A1 * | 6/2005 | Best | H04L 25/0278 326/30 |
| 2020/0265878 A1 * | 8/2020 | Ahn | G11C 7/1051 |

* cited by examiner

*Primary Examiner* — Anh Q Tran
(74) *Attorney, Agent, or Firm* — WILLIAM PARK & ASSOCIATES LTD.

(57) ABSTRACT

A semiconductor apparatus includes a calibration circuit, a selection circuit, and a data circuit. The calibration circuit generates a plurality of calibration signals by being coupled to a plurality of reference resistors. The selection circuit selects at least one signal among the plurality of calibration signals on the basis of an impedance setting signal. The data circuit sets an impedance based on the selected calibration signal.

21 Claims, 10 Drawing Sheets

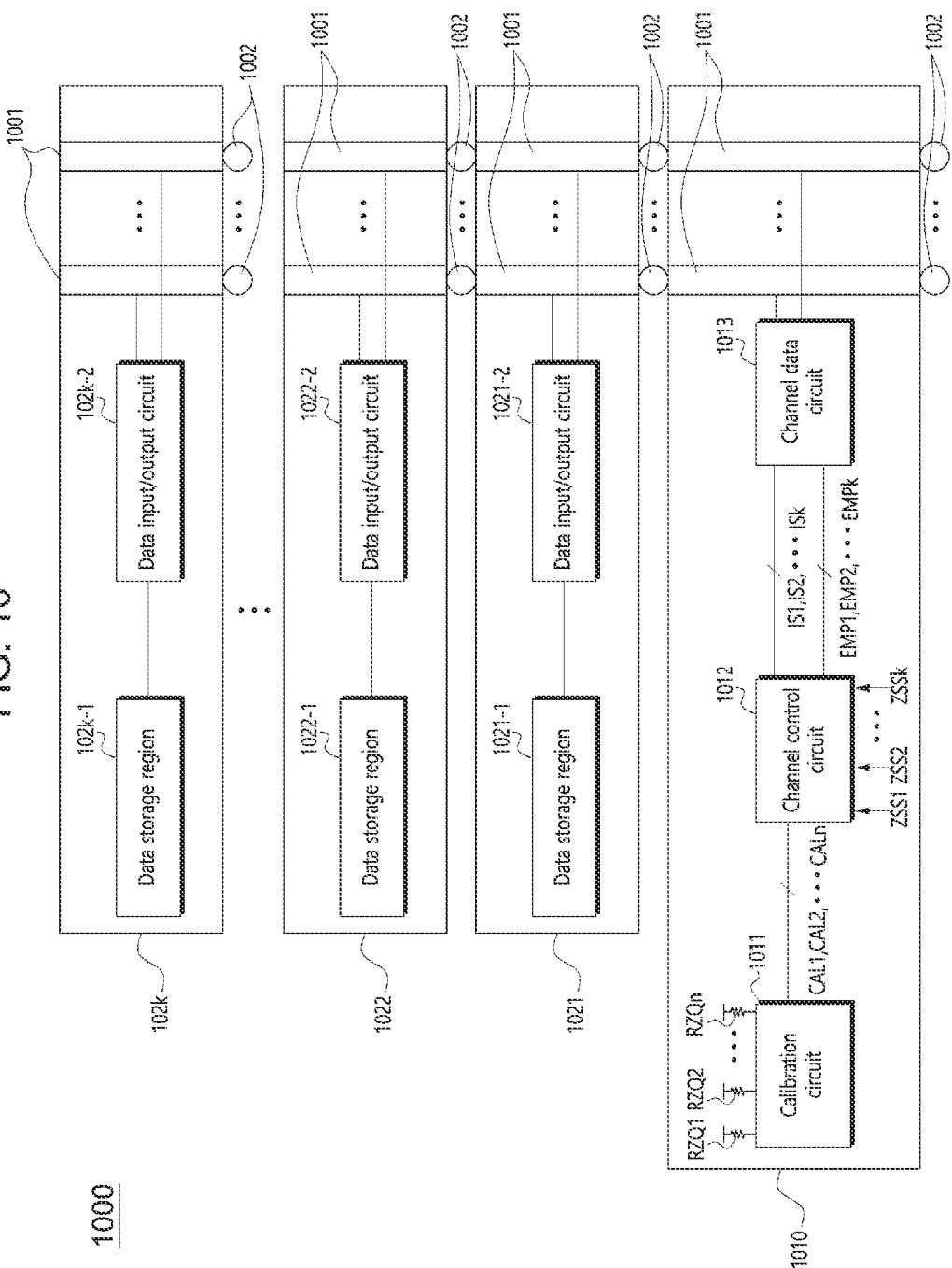

SEMICONDUCTOR APPARATUS INCLUDING CALIBRATION CIRCUIT

CROSS-REFERENCES TO RELATED APPLICATION

The present application claims priority under 35 U.S.C. § 119(a) to Korean application number 10-2021-0113997, filed on Aug. 27, 2021, in the Korean intellectual Property Office, which is incorporated herein by reference in its entirety.

BACKGROUND

1. Technical Field

Various embodiments generally relate to an integrated circuit technology, and more particularly, to a calibration circuit and a semiconductor apparatus using the same.

2. Related Art

Electronic apparatuses may each include a large number of electronic components. Among the electronic apparatuses, a computer system may include a large number of electronic components which are configured by semiconductors. Each of semiconductor apparatuses which configure the computer system may include a data transmission apparatus and thereby, may transmit data. As the operation speeds of semiconductor apparatuses are increased and the power consumptions of the semiconductor apparatuses are reduced, signals which are transmitted may be distorted due to the influence of external noise and impedance mismatching between semiconductor apparatuses communicating with each other. Therefore, each of semiconductor apparatuses may perform an operation of matching the impedance or resistance of the data transmission apparatus.

Thus, it is the norm that a semiconductor apparatus includes an on-die termination circuit which performs impedance matching for precise signal transmission. Moreover, the semiconductor apparatus needs to perform a calibration of a termination resistance depending on a PVT variation such that precise impedance matching may be achieved. In general, a memory apparatus is coupled with an external reference resistor, and calibrates the impedance value of the termination resistance by performing a calibration operation using the external reference resistor. This is generally referred to as a ZQ calibration operation.

SUMMARY

In an embodiment, a semiconductor apparatus may include a first reference resistor and a second reference resistor having different resistance values from each other. The semiconductor apparatus may include a calibration circuit, a selection circuit, and a data circuit. The calibration circuit may be configured to generate a first calibration signal by being coupled to the first reference resistor and performing a first calibration operation, and generate a second calibration signal by being coupled to the second reference resistor and performing a second calibration operation. The selection circuit may be configured to generate an impedance control signal by selecting one of the first and second calibration signals based on an impedance setting signal. The data circuit may be configured to set an impedance based on the impedance control signal.

In an embodiment, a semiconductor apparatus may include a calibration circuit, a selection circuit, an emphasis control circuit, and a data circuit. The calibration circuit may be configured to generate a first calibration signal by being coupled to a first reference resistor and performing a first calibration operation, and generate a second calibration signal by being coupled to a second reference resistor which has a resistance value different from that of the first reference resistor and performing a second calibration operation. The selection circuit may be configured to generate an impedance control signal by selecting one of the first and second calibration signals based on an impedance setting signal. The emphasis control circuit may be configured to generate an emphasis control signal based on the impedance control signal and an emphasis selection signal. The data circuit may be configured to set an impedance based on the impedance control signal and the emphasis control signal.

In an embodiment, a semiconductor apparatus may include a calibration circuit, a selection circuit, and a data circuit. The calibration circuit may be configured to perform a calibration operation by being coupled to each of a plurality of reference resistors having different values, and generate a plurality of pull-up calibration signals and a plurality of pull-down calibration signals. The selection circuit may be configured to, based on an impedance setting signal, provide one signal among the plurality of pull-up calibration signals as a pull-up impedance control signal and provide one signal among the plurality of pull-down calibration signals as a pull-down impedance control signal. The data circuit may be configured to set an impedance based on the pull-up impedance control signal and the pull-down impedance control signal.

In an embodiment, a semiconductor apparatus may include a calibration circuit, a first channel control circuit and a first channel data circuit. The calibration circuit may be configured to generate a plurality of calibration signals by being coupled to a plurality of reference resistors which have different resistance values and performing a calibration operation. The first channel control circuit may be configured to receive the plurality of calibration signals, and generate an impedance control signal of a first channel by selecting one signal among the plurality of calibration signals based on an impedance setting signal of the first channel. The first channel data circuit may include a plurality of data circuits each of which sets an impedance based on the impedance control signal of the first channel.

BRIEF DESCRIPTION OF THE DRAWINGS

FIG. 10 is a diagram illustrating a configuration of a semiconductor apparatus in accordance with an embodiment of the present disclosure.

DETAILED DESCRIPTION

Hereinafter, a semiconductor apparatus including a calibration circuit will be described with reference to the accompanying drawings through various examples of embodiments.

Figure 1:
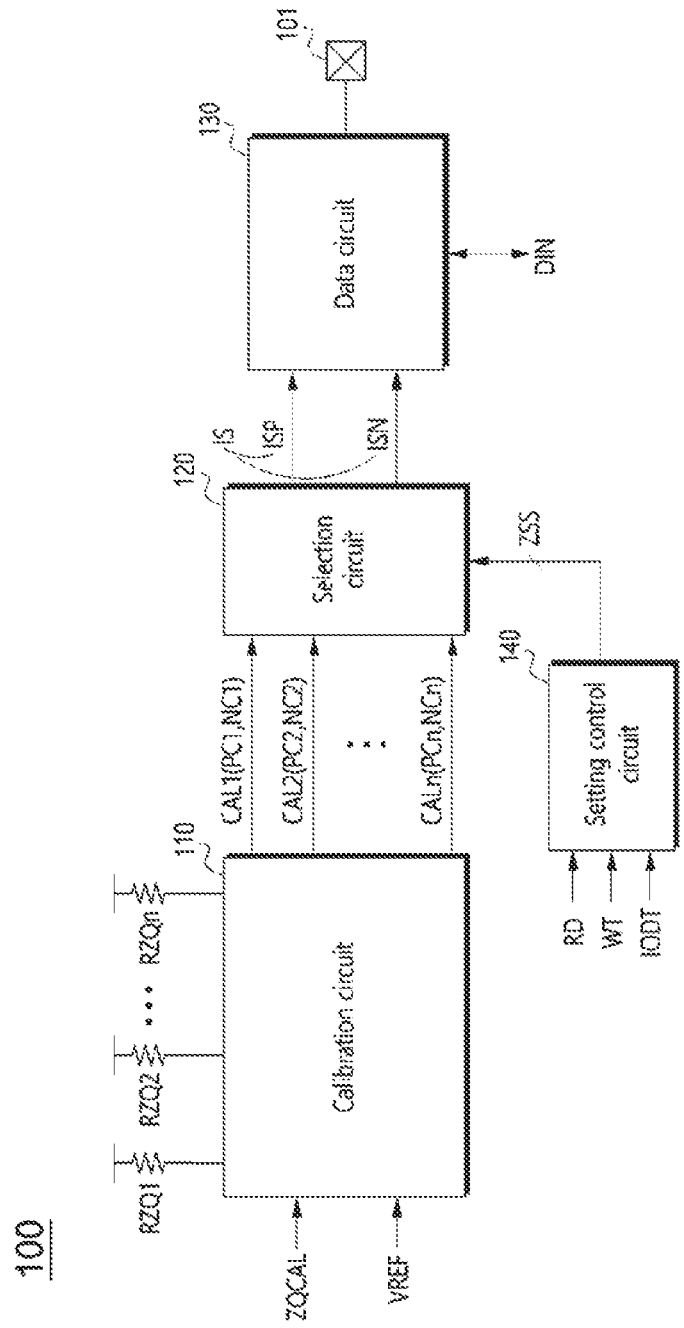
FIG. 1 is a diagram illustrating a configuration of a semiconductor apparatus in accordance with an embodiment of the present disclosure.

FIG. 1 is a diagram illustrating the configuration of a semiconductor apparatus 100 in accordance with an embodiment of the present disclosure, Referring to FIG. 1, the semiconductor apparatus 100 may include a plurality of reference resistors RZQ1, RZQ2, . . . RZQn, and may perform a calibration operation by being coupled to the plurality of reference resistors RZQ1, RZQ2, . . . RZQn. Here, n may be an arbitrary integer equal to or greater than 3. The plurality of reference resistors RZQ1, RZQ2, . . . RZQn may have different resistance values. For example, the plurality of reference resistors RZQ1, RZQ2, . . . RZQn may have resistance values that sequentially decrease. A first reference resistor RZQ1 may have a largest resistance value, and a second reference resistor RZQ2 may have a resistance value smaller than the first reference resistor RZQ1. An nth reference resistor RZQn may have a smallest resistance value. The plurality of reference resistors RZQ1, RZQ2, . . . RZQn may be included in the semiconductor apparatus 100. The semiconductor apparatus 100 may generate a plurality of calibration signals CAL1, CAL2, . . . CALn by performing a calibration operation. Each of the calibration signals CAL1, CAL2, CALn may include a pull-up calibration signal and a pull-down calibration signal. The semiconductor apparatus 100 may select one of the plurality of calibration signals CAL1, CAL2, . . . CALn on the basis of an impedance setting signal ZSS, and may use the selected calibration signal as an impedance control signal IS. The impedance control signal IS may include a pull-up impedance control signal ISP and a pull-down impedance control signal ISN. A pull-up calibration signal of the selected calibration signal may be provided as the pull-up impedance control signal ISP, and a pull-down calibration signal of the selected calibration signal may be provided as the pull-down impedance control signal ISN.

The semiconductor apparatus 100 may include a calibration circuit 110, a selection circuit 120, and a data circuit 130. The calibration circuit 110 may perform a calibration operation by being coupled to the plurality of reference resistors RZQ1, RZQ2, . . . RZQn. The calibration circuit 110 may generate the plurality of calibration signals CAL1, CAL2, . . . CALn by performing a calibration operation. The calibration circuit 110 may perform a calibration operation by being coupled to the first reference resistor RZQ1, and thereby, may generate a first calibration signal CAL1. The first calibration signal CAL1 may include a first pull-up calibration signal PC1 and a first pull-down calibration signal NC1. The calibration circuit 110 may perform a calibration operation by being coupled to the second reference resistor RZQ2, and thereby, may generate a second calibration signal CAL2. The second calibration signal CAL2 may include a second pull-up calibration signal PC2 and a second pull-down calibration signal NC2. The calibration circuit 110 may perform a calibration operation by being coupled to the nth reference resistor RZQn, and thereby, may generate an nth calibration signal CALn. The nth calibration signal CALn may include an nth pull-up calibration signal PCn and an nth pull-down calibration signal NCn. The calibration circuit 110 may generate the first to nth calibration signals CAL1, CAL2, . . . CALn by performing a plurality of calibration operations in parallel. In an embodiment, the calibration circuit 110 may sequentially generate the first to nth calibration signals CAL1, CAL2, . . . CALn by sequentially performing a plurality of calibration operations.

The calibration circuit 110 may receive a calibration command signal ZQCAL and a reference voltage VREF. The calibration command signal ZQCAL may be a signal which instructs the calibration circuit 110 to perform a calibration operation. The calibration command signal ZQCAL may be generated on the basis of a command signal provided from an external apparatus communicating with the semiconductor apparatus 100, or may be a signal which is internally generated by the semiconductor apparatus 100 to perform a calibration operation. The reference voltage VREF may be used as a reference for performing a calibration operation.

The first to nth pull-up calibration signals PC1, PC2, . . . PCn and the first to nth pull-down calibration signals NC1, NC2, . . . NCn may be digital signals which have the same number of bits. The first to nth pull-up calibration signals PC1, PC2, . . . PCn may have different logic values depending on resistance values of the first to nth reference resistors RZQ1, RZQ2, . . . RZQn. The first to nth pull-down calibration signals NC1, NC2, . . . NCn may have different logic values depending on resistance values of the first to nth reference resistors RZQ1, RZQ2, . . . RZQn. In an embodiment, the first to nth pull-up calibration signals PC1, PC2, . . . PCn and the first to nth pull-down calibration signals NC1, NC2, . . . NCn may be analog voltage signals. The first to nth pull-up calibration signals PC1, PC2, . . . PCn may have different voltage levels depending on resistance values of the first to nth reference resistors RZQ1, RZQ2, . . . RZQn. The first to nth pull-down calibration signals NC1, NC2, . . . NCn may have different voltage levels depending on resistance values of the first to nth reference resistors RZQ1, RZQ2, . . . RZQn.

The selection circuit 120 may be coupled to the calibration circuit 110, and may receive the plurality of calibration signals CAL1, CAL2, . . . CALn from the calibration circuit 110. The selection circuit 120 may receive the impedance setting signal ZSS. The impedance setting signal ZSS may include information on an impedance value that the data circuit 130 should have for impedance matching between the semiconductor apparatus 100 and the external apparatus communicating with the semiconductor apparatus 100, The selection circuit 120 may select one of the plurality of calibration signals CAL1, CAL2, . . . CALn on the basis of the impedance setting signal ZSS, and may output the selected calibration signal as the impedance control signal IS. The selection circuit 120 may generate the impedance control signal IS by selecting one of the first to nth calibration signals CAL1, CAL2, . . . CALn on the basis of the impedance setting signal ZSS. The impedance control signal IS may include the pull-up impedance control signal ISP and the pull-down impedance control signal ISN, A pull-up calibration signal selected among the first to nth pull-up calibration signals PC1, PC2, . . . PCn may be provided as the pull-up impedance control signal ISP. A pull-down calibration signal selected among the first to nth pull-down calibration signals NC1, NC2, . . . NCn may be provided as the pull-down impedance control signal ISN. For example, when the selection circuit 120 provides the second calibration signal CAL2 as the impedance control signal IS on the basis of the impedance setting signal ZSS, the second pull-up calibration signal PC2 may be provided as the pull-up impedance control signal ISP, and the second pull-down calibration signal NC2 may be provided as the pull-down impedance control signal ISN.

The data circuit 130 may be coupled to the selection circuit 120, and may receive the impedance control signal IS from the selection circuit 130. The data circuit 130 may set the impedance of the data circuit 130 on the basis of the impedance control signal IS. The data circuit 130 may set the pull-up impedance value of the data circuit 130 on the basis of the pull-up impedance control signal ISP, and may set the pull-down impedance value of the data circuit 130 on the basis of the pull-down impedance control signal ISN. The data circuit 130 may be coupled to a data pad 101. The data circuit 130 may receive internal data DIN or output the internal data DIN. The data circuit 130 may drive the data pad 101 on the basis of the internal data DIN, and thereby, may output data corresponding to the internal data DIN through the data pad 101. The data circuit 130 may output data, received through the data pad 101, as the internal data DIN. An operation in which the data circuit 130 drives the data pad 101 on the basis of the internal data DIN may be referred to as a read operation, and an operation in which the data circuit 130 outputs data, received through the data pad 101, as the internal data DIN may be referred to as a write operation. During the read operation, the data circuit 130 may set the impedance of the data circuit 130 on the basis of the impedance control signal IS, and thereby, may adjust the driving force and strength of the data circuit 130 for driving the data pad 101. During the write operation, the data circuit 130 may set the impedance of the data circuit 130 on the basis of the impedance control signal IS, and thereby, may set termination resistance for receiving data through the data pad 101. In an embodiment, even when the read and write operations are not performed, the data circuit 130 may set the impedance of the data circuit 130 on the basis of the impedance control signal IS. For example, when another semiconductor apparatus coupled to the external apparatus is provided together with the semiconductor apparatus 100, the data circuit 130 may provide termination resistance for write and read operations of the other semiconductor apparatus.

The semiconductor apparatus 100 may further include a setting control circuit 140. The setting control circuit 140 may receive a plurality of internal command signals, and may generate the impedance setting signal ZSS on the basis of the plurality of internal command signals. The plurality of internal command signals may be generated on the basis of command signals provided from the external apparatus coupled to the semiconductor apparatus 100. For example, the internal command signals may include a read signal RD for a read operation of the semiconductor apparatus 100, a write signal WT for a write operation of the semiconductor apparatus 100, and an internal termination signal IODT for non-target read and non-target write operations of the semiconductor apparatus 100. The non-target read and non-target write operations may mean operations in which, when another semiconductor apparatus different from the semiconductor apparatus 100 performs read and write operations, the semiconductor apparatus 100 provides termination resistance for the other semiconductor apparatus. The setting control circuit 140 may store a plurality of impedance setting information. The setting control circuit 140 may be a mode register circuit. The setting control circuit 140 may select at least one of the plurality of impedance setting information on the basis of the read signal RD, the write signal WT and the internal termination signal IODT, and may output the selected impedance setting information as the impedance setting signal ZSS. The plurality of impedance setting information stored in the setting control circuit 140 and the impedance setting signal ZSS may be digital signals each including a plurality of bits.

Figure 2:
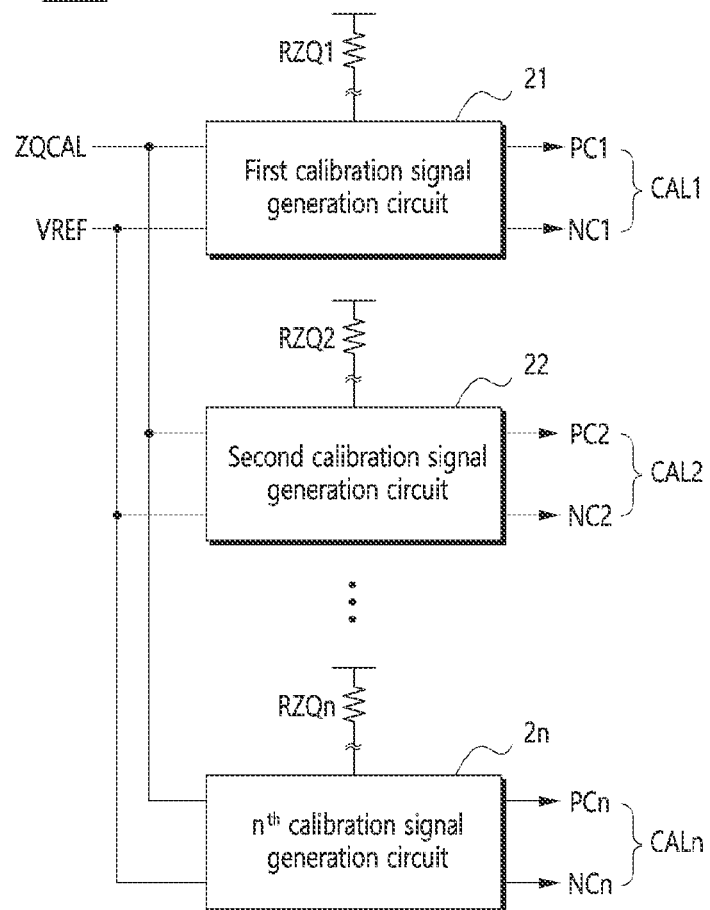
FIG. 2 is a diagram illustrating a configuration of a calibration circuit illustrated in FIG. 1.

FIG. 2 is a diagram illustrating the configuration of the calibration circuit 110 illustrated in FIG. 1. Referring to FIG. 2, the calibration circuit 110 may include a plurality of calibration signal generation circuits. The number of calibration signal generation circuits included in the calibration circuit 110 may correspond to the number of reference resistors. The plurality of calibration signal generation circuits may be coupled one to one to a plurality of reference resistors. The calibration circuit 110 may include first to nth calibration signal generation circuits 21, 22, . . . 2n. The first to nth calibration signal generation circuits 21, 22, . . . 2n may receive in common the calibration command signal ZQCAL and the reference voltage VREF. The first calibration signal generation circuit 21 may perform a calibration operation by being coupled to the first reference resistor RZQ1 on the basis of the calibration command signal ZQCAL and the reference voltage VREF. The first calibration signal generation circuit 21 may generate the first calibration signal CAL1 by performing the calibration operation. The first calibration signal CAL1 may include the first pull-up calibration signal PC1 and the first pull-down calibration signal NC1. The second calibration signal generation circuit 22 may perform a calibration operation by being coupled to the second reference resistor RZQ2 on the basis of the calibration command signal ZQCAL and the reference voltage VREF. The second calibration signal generation circuit 22 may generate the second calibration signal CAL2 by performing the calibration operation. The second calibration signal CAL2 may include the second pull-up calibration signal PC2 and the second pull-down calibration signal NC2. The nth calibration signal generation circuit 2n may perform a calibration operation by being coupled to the nth reference resistor RZQn on the basis of the calibration command signal ZQCAL and the reference voltage VREF. The nth calibration signal generation circuit 2n may generate the nth calibration signal CALn by performing the calibration operation. The nth calibration signal CALn may include the nth pull-up calibration signal PCn and the nth pull-down calibration signal NCn. The first to nth calibration signal generation circuits 21, 22, 2n may generate the first to nth calibration signals CAL1, CAL2, CALn by performing calibration operations simultaneously and/or in parallel on the basis of the calibration command signal ZQCAL. In an embodiment, the calibration command signal ZQCAL may be sequentially provided to the first to nth calibration signal generation circuits 21, 22, . . . 2n, and calibration operations of the first to nth calibration signal generation circuits 21, 22, . . . 2n may be sequentially performed.

Figure 3:
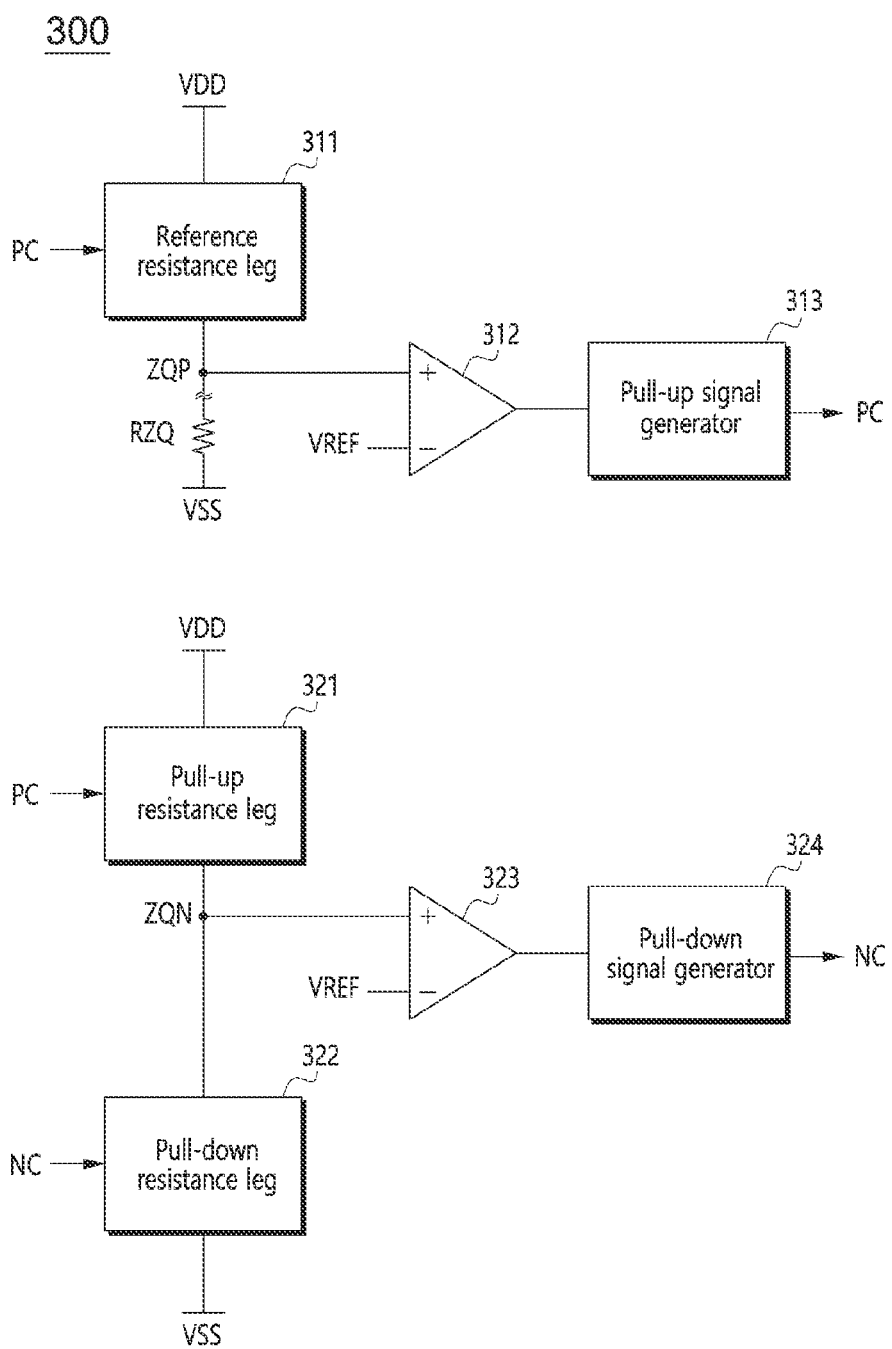
FIG. 3 is a diagram illustrating a configuration of a calibration signal generation circuit in accordance with an embodiment of the present disclosure.

FIG. 3 is a diagram illustrating the configuration of a calibration signal generation circuit 300 in accordance with an embodiment of the present disclosure. The calibration signal generation circuit 300 may be applied as each of the first to nth calibration signal generation circuits 21, 22, . . . 2n illustrated in FIG. 2. Referring to FIG. 3, the calibration signal generation circuit 300 may include a reference resistance leg 311, a first comparator 312, a pull-up signal generator 313, a pull-up resistance leg 321, a pull-down resistance leg 322, a second comparator 323, and a pull-down signal generator 324. The reference resistance leg 311 may be coupled to a terminal to which a first power supply voltage VDD is supplied and a pull-up calibration node ZQP. The reference resistance leg 311 may receive a pull-up calibration signal PC, and may be adjusted in the resistance value thereof on the basis of the pull-up calibration signal PC. The reference resistance leg 311 may be coupled to a reference resistor RZQ through the pull-up calibration node ZQP. The reference resistor RZQ may be coupled between the pull-up calibration node ZQP and a terminal to which a second power supply voltage VSS is supplied. The first power supply voltage VDD may be supply power, and the second power supply voltage VSS may be a ground voltage. A reference voltage VREF may have a voltage level between the first power supply voltage VDD and the second power supply voltage VSS, For example, the reference voltage VREF may have a medium voltage level between the first power supply voltage VDD and the second power supply voltage VSS. The voltage level of the pull-up calibration node ZQP may be determined depending on the ratio between the resistance value of the reference resistance leg 311 and the resistance value of the reference resistor RZQ.

The first comparator 312 may be coupled to the pull-up calibration node ZQP, and may receive the reference voltage VREF. The first comparator 312 may compare the voltage level of the pull-up calibration node ZQP and the reference voltage VREF. The pull-up signal generator 313 may be coupled to the first comparator 312 and receive the output of the first comparator 312. The pull-up signal generator 313 may change the value of the pull-up calibration signal PC on the basis of the output of the first comparator 312. For example, when the voltage level of the pull-up calibration node ZQP is higher than the reference voltage VREF, the pull-up signal generator 313 may increase the value of the pull-up calibration signal PC and thereby increase the resistance value of the reference resistance leg 311. When the voltage level of the pull-up calibration node ZQP is lower than the reference voltage VREF, the pull-up signal generator 313 may decrease the value of the pull-up calibration signal PC and thereby decrease the resistance value of the reference resistance leg 311. The pull-up signal generator 313 may fix the value of the pull-up calibration signal PC when the resistance value of the reference resistance leg 311 and the resistance value of the reference resistor RZQ are substantially the same.

The pull-up resistance leg 321 may be coupled between a terminal to which the first power supply voltage VDD is supplied and a pull-down calibration node ZQN. The pull-up resistance leg 321 may receive the pull-up calibration signal PC, and may be adjusted in the resistance value thereof on the basis of the pull-up calibration signal PC. The pull-up resistance leg 321 may be configured substantially the same as the reference resistance leg 311. Accordingly, when the value of the pull-up calibration signal PC is fixed by the pull-up signal generator 313, the pull-up resistance leg 321 may have the same resistance value as the reference resistor RZQ. The pull-down resistance leg 322 may be coupled between the pull-down calibration node ZQN and a terminal to which the second power supply voltage VSS is supplied. The pull-down resistance leg 322 may receive a pull-down calibration signal NC, and may be adjusted in the resistance value thereof on the basis of the pull-down calibration signal NC. The voltage level of the pull-down calibration node ZQN may be determined depending on the ratio between the resistance value of the pull-up resistance leg 321 and the resistance value of the pull-down resistance leg 322.

The second comparator 323 may be coupled to the pull-down calibration node ZQN, and may receive the reference voltage VREF. The second comparator 323 may compare the voltage level of the pull-down calibration node ZQN and the reference voltage VREF. The pull-down signal generator 324 may be coupled to the second comparator 323 and receive the output of the second comparator 323. The pull-down signal generator 324 may change the value of the pull-down calibration signal NC on the basis of the output of the second comparator 323. For example, when the voltage level of the pull-down calibration node ZQN is higher than the reference voltage VREF, the pull-down signal generator 324 may increase the value of the pull-down calibration signal NC and thereby decrease the resistance value of the pull-down resistance leg 322. When the voltage level of the pull-down calibration node ZQN is lower than the reference voltage VREF, the pull-down signal generator 324 may decrease the value of the pull-down calibration signal NC and thereby increase the resistance value of the pull-down resistance leg 322. The pull-down signal generator 324 may fix the value of the pull-down calibration signal NC when the resistance value of the pull-up resistance leg 321 and the resistance value of the pull-down resistance leg 322 are substantially the same.

When a calibration operation is performed, the value of the pull-up calibration signal PC may be set first. The first comparator 312 and the pull-up signal generator 313 may adjust the value of the pull-up calibration signal PC until the resistance value of the reference resistance leg 311 becomes substantially the same as the resistance value of the reference resistor RZQ. When the setting of the pull-up calibration signal PC is completed, the value of the pull-down calibration signal NC may be set. The resistance value of the pull-up resistance leg 321 may be set according to the pull-up calibration signal PC. The second comparator 323 and the pull-down signal generator 324 may adjust the value of the pull-down calibration signal NC until the resistance value of the pull-down resistance leg 322 becomes substantially the same as the resistance value of the pull-up resistance leg 321. In an embodiment, the calibration signal generation circuit 300 may include a reference resistance leg which has substantially the same configuration as the pull-down resistance leg 322, and may be modified to first set the pull-down calibration signal NC and then set the pull-up calibration signal PC.

Figure 4:
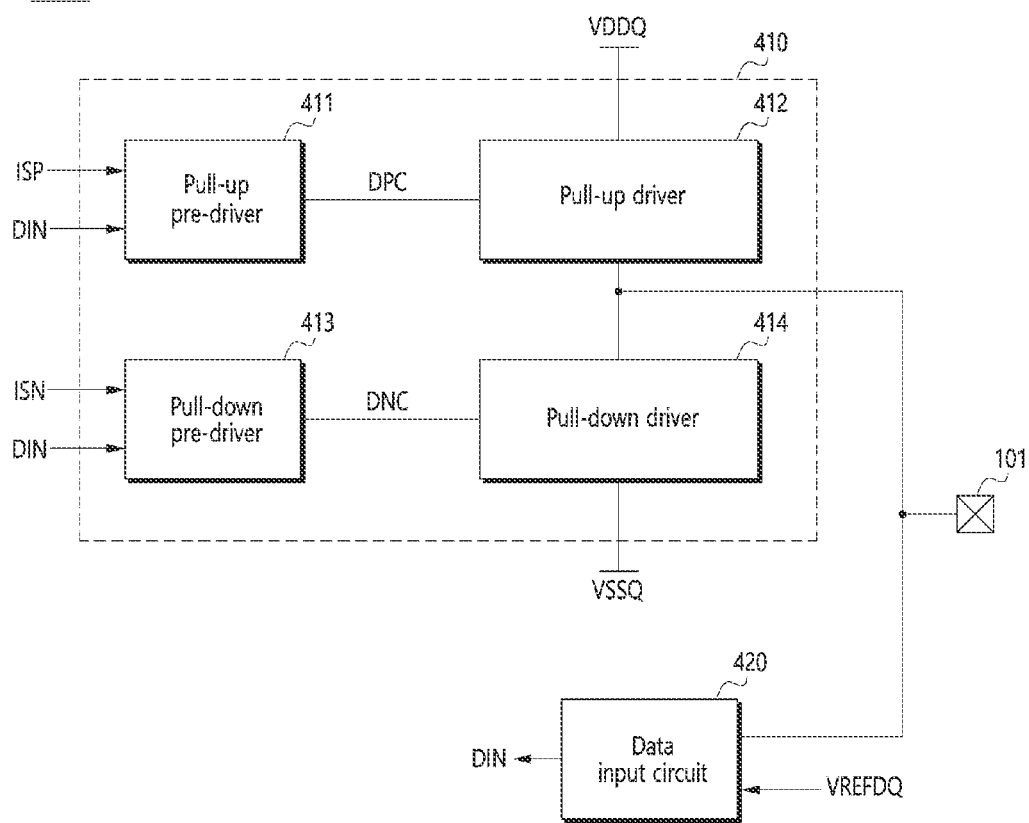
FIG. 4 is a diagram illustrating a configuration of a data circuit illustrated in FIG. 1.

FIG. 4 is a diagram illustrating the configuration of the data circuit 130 illustrated in FIG. 1, Referring to FIG. 4, the data circuit 130 may include a data output circuit 410 and a data input circuit 420. The data output circuit 410 and the data input circuit 420 may be coupled in common to a line through which internal data DIN is transmitted and the data pad 101. The data output circuit 410 may receive the impedance control signals ISP and ISN and the internal data DIN, may set an impedance on the basis of the impedance control signals ISP and ISN and the internal data DIN, and may drive the data pad 101. The data input circuit 420 may generate the internal data DIN from data received through the data pad 101. The data input circuit 420 may receive a data reference voltage VREFDQ. The data input circuit 420 may generate the internal data DIN by comparing data received through the data pad 101 with the data reference voltage VREFDQ. The data reference voltage VREFDQ may have a voltage level capable of determining the logic level of the data.

The data output circuit 410 may include a pull-up pre-driver 411, a pull-up driver 412, a pull-down pre-driver 413 and a pull-down driver 414. The pull-up pre-driver 411 may receive the pull-up impedance control signal ISP and the internal data DIN. The pull-up pre-driver 411 may generate a pull-up driving signal DPC on the basis of the pull-up impedance control signal ISP and the internal data DIN. The pull-up driver 412 may be coupled to the pull-up pre-driver 411 and receive the pull-up driving signal DPC from the pull-up pre-driver 411. The pull-up driver 412 may be coupled between a terminal to which a first data power supply voltage VDDQ is supplied and the data pad 101. The first data power supply voltage VDDQ may have substantially the same voltage level as the first power supply voltage VDD shown in FIG. 3. In an embodiment, a terminal to which the first data power supply voltage VDDQ is supplied and a terminal to which the first power supply voltage VDD is supplied may be electrically isolated from each other. The pull-up driver 412 may set the pull-up impedance of the data output circuit 410 on the basis of the pull-up driving signal DPC, and may pull-up drive the data pad 101.

The pull-down pre-driver 413 may receive the pull-down impedance control signal ISN and the internal data DIN. The pull-down pre-driver 413 may generate a pull-down driving signal DNC on the basis of the pull-down impedance control signal ISN and the internal data DIN. The pull-down driver 414 may be coupled to the pull-down pre-driver 413 and receive the pull-down driving signal DNC from the pull-down pre-driver 413. The pull-down driver 414 may be coupled between the data pad 101 and a terminal to which a second data power supply voltage VSSQ is supplied. The second data power supply voltage VSSQ may have substantially the same voltage level as the second power supply voltage VSS shown in FIG. 3, In an embodiment, a terminal to which the second data power supply voltage VSSQ is supplied and a terminal to which the second power supply voltage VSS is supplied may be electrically isolated from each other. The pull-down driver 414 may set the pull-down impedance of the data output circuit 410 on the basis of the pull-down driving signal DNC, and may pull-down drive the data pad 101.

Although not illustrated, the pull-up driver 412 may include a plurality of drivers coupled in parallel between a terminal to which the first data power supply voltage VDDQ is supplied and the data pad 101, and the pull-down driver 414 may include a plurality of drivers coupled in parallel between the data pad 101 and a terminal to which the second data power supply voltage VSSQ is supplied. In the conventional art, a calibration circuit is coupled to one reference resistor and generates one calibration signal on the basis of the one reference resistor, and the impedance values of a plurality of drivers of a pull-up driver and a pull-down driver are set on the basis of the one calibration signal. A conventional data circuit may separately receive an impedance setting signal, and by adjusting the number of drivers to be turned on, according to the impedance setting signal, may set the impedance of the data circuit. For example, when a target impedance value is 48 ohms, the impedance value of each of a plurality of drivers of the data circuit is set to 240 ohms on the basis of the one calibration signal, and by adjusting the number of drivers, to be turned on, on the basis of the impedance setting signal, the impedance of the data circuit is set to 48 ohms. That is to say, when the number of drivers is six, by turning on five drivers and turning off one driver, the pull-up driver or the pull-down driver is set to have the impedance of 48 ohms. However, because the impedance value of the driver nonlinearly changes according to a change in the value of the calibration signal, when the impedance of the data circuit is set in the conventional manner, the impedance of the data circuit may be different from the target impedance. Because impedance matching becomes incomplete as the difference between the impedance of the data circuit and the target impedance increases, the valid duration and/or the valid window of data outputted and received through a data pad may decrease. The semiconductor apparatus 100 in accordance with the embodiment of the present disclosure may generate the plurality of calibration signals CAL1, CAL2, and CALn from the plurality of reference resistors RZQ1, RZQ2, and RZQn having resistance values corresponding to a target impedance, and by using the impedance control signal IS by selecting a calibration signal corresponding to the target impedance according to the impedance setting signal ZSS, may set the impedance of the data circuit 130 to be closest to the target impedance. Accordingly, it is possible to make impedance matching substantially perfect or more accurate and extend the valid duration of data. In addition, because an impedance may be set using the impedance control signal IS on which the impedance setting signal ZSS is reflected, the circuit areas and power consumption of the pre-drivers 411 and 413 may be reduced.

Figure 5:
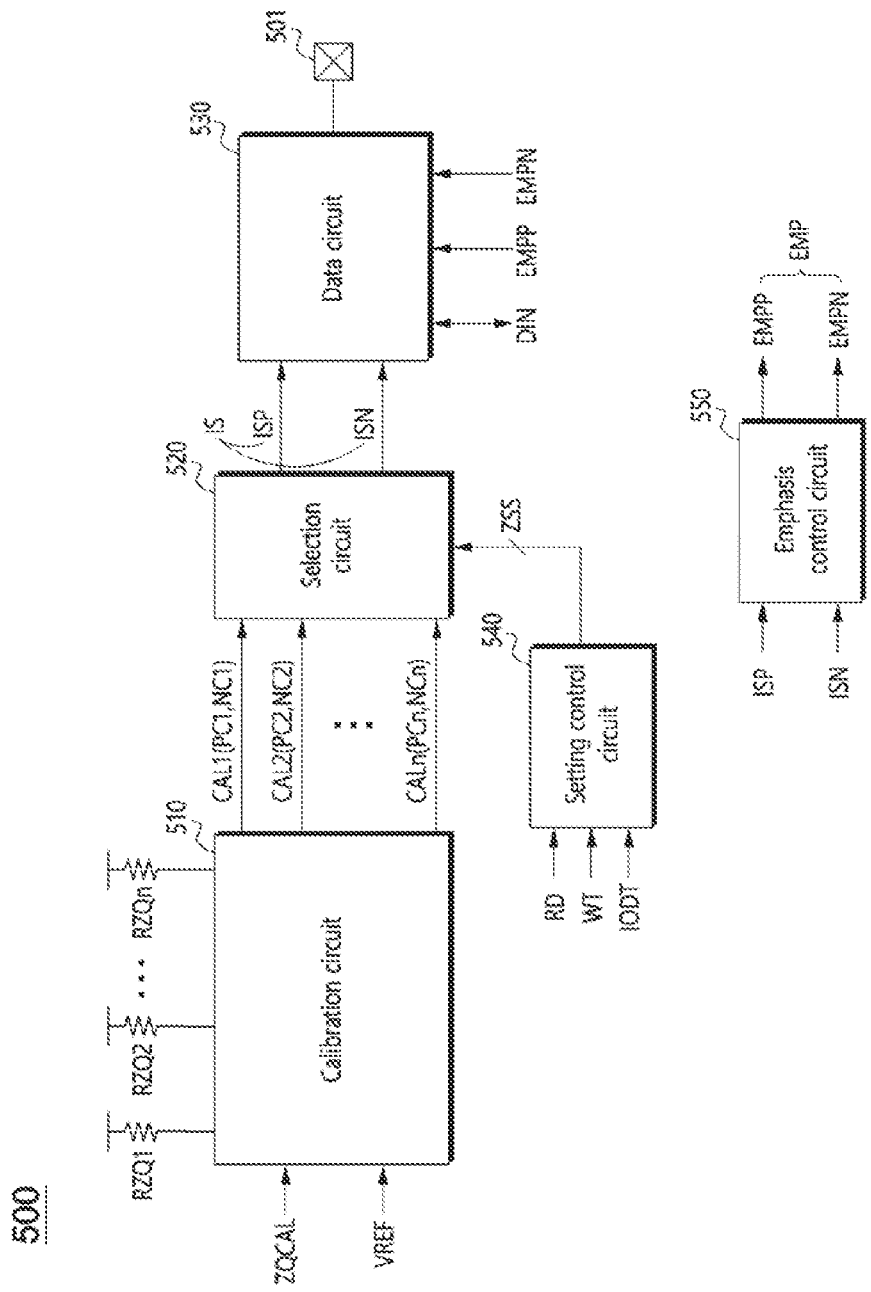
FIG. 5 is a diagram illustrating a configuration of a semiconductor apparatus in accordance with an embodiment of the present disclosure.

FIG. 5 is a diagram illustrating the configuration of a semiconductor apparatus 500 in accordance with an embodiment of the present disclosure. Referring to FIG. 5, the semiconductor apparatus 500 may include a plurality of reference resistors RZQ1, RZQ2, . . . RZQn, and may perform a calibration operation by being coupled to the plurality of reference resistors RZQ1, RZQ2, . . . RZQn. Here, n may be an arbitrary integer equal to or greater than 3. The plurality of reference resistors RZQ1, RZQ2, . . . RZQn may have different resistance values. For example, the plurality of reference resistors RZQ1, RZQ2, . . . RZQn may have resistance values that sequentially decrease. A first reference resistor RZQ1 may have a largest resistance value, and a second reference resistor RZQ2 may have a resistance value smaller than the first reference resistor RZQ1. An nth reference resistor RZQn may have a smallest resistance value. The plurality of reference resistors RZQ1, RZQ2, . . . RZQn may be included in the semiconductor apparatus 500. The semiconductor apparatus 500 may generate a plurality of calibration signals CAL1, CAL2, . . . CALn by performing a calibration operation, Each of the calibration signals CAL1, CAL2, . . . CALn may include a pull-up calibration signal and a pull-down calibration signal. The semiconductor apparatus 500 may select at least one of the plurality of calibration signals CAL1, CAL2, . . . CALn on the basis of an impedance setting signal ZSS, and may use the selected calibration signal as an impedance control signal IS. The semiconductor apparatus 500 may generate a plurality of emphasis signals on the basis of the impedance control signal IS, and may perform an emphasis operation by generating at least one of the plurality of emphasis signals as an emphasis control signal EMP.

The semiconductor apparatus 500 may include a calibration circuit 510, a selection circuit 520, an emphasis control circuit 550, and a data circuit 530. The calibration circuit 510 may perform a calibration operation by being coupled to the plurality of reference resistors RZQ1, RZQ2, . . . RZQn. The calibration circuit 510 may generate the plurality of calibration signals CAL1, CAL2, . . . CALn by performing a calibration operation. The calibration circuit 510 may perform a calibration operation by being coupled to the first reference resistor RZQ1, and thereby, may generate a first calibration signal CAL1. The first calibration signal CAL1 may include a first pull-up calibration signal PC1 and a first pull-down calibration signal NC1. The calibration circuit 510 may perform a calibration operation by being coupled to the second reference resistor RZQ2, and thereby, may generate a second calibration signal CAL2. The second calibration signal CAL2 may include a second pull-up calibration signal PC2 and a second pull-down calibration signal NC2. The calibration circuit 510 may perform a calibration operation by being coupled to the nth reference resistor RZQn, and thereby, may generate an nth calibration signal CALn. The nth calibration signal CALn may include an nth pull-up calibration signal PCn and an nth pull-down calibration signal NCn. The calibration circuit 510 may generate the first to nth calibration signals CAL1, CAL2, . . . CALn by performing a plurality of calibration operations in parallel. In an embodiment, the calibration circuit 510 may sequentially generate the first to nth calibration signals CAL1, CAL2, . . . CALn by sequentially performing a plurality of calibration operations.

The calibration circuit 510 may receive a calibration command signal ZQCAL and a reference voltage VREF. The calibration command signal ZQCAL may be a signal which instructs the calibration circuit 510 to perform a calibration operation. The calibration command signal ZQCAL may be generated on the basis of a command signal provided from an external apparatus communicating with the semiconductor apparatus 500, or may be a signal which is internally generated by the semiconductor apparatus 500 to perform a calibration operation. The reference voltage VREF may be used as a reference for performing a calibration operation.

The first to nth pull-up calibration signals PC1, PC2, . . . PCn and the first to nth pull-down calibration signals NC1, NC2, . . . NCn may be digital signals which have the same number of bits. The first to nth pull-up calibration signals PC1, PC2, . . . PCn may have different logic values depending on resistance values of the first to nth reference resistors RZQ1, RZQ2, . . . RZQn. The first to nth pull-down calibration signals NC1, NC2, NCn may have different logic values depending on resistance values of the first to nth reference resistors RZQ1, RZQ2, . . . RZQn. In an embodiment, the first to nth pull-up calibration signals PC1, PC2, . . . PCn and the first to nth pull-down calibration signals NC1, NC2, . . . NCn may be analog voltage signals. The first to nth pull-up calibration signals PC1, PC2, . . . PCn may have different voltage levels depending on resistance values of the first to nth reference resistors RZQ1, RZQ2, . . . RZQn. The first to nth pull-down calibration signals NC1, NC2, . . . NCn may have different voltage levels depending on resistance values of the first to nth reference resistors RZQ1, RZQ2, . . . RZQn.

The selection circuit 520 may be coupled to the calibration circuit 510, and may receive the plurality of calibration signals CAL1, CAL2, . . . CALn from the calibration circuit 510. The selection circuit 520 may receive the impedance setting signal ZSS. The selection circuit 520 may select at least one of the plurality of calibration signals CAL1, CAL2, . . . CALn on the basis of the impedance setting signal ZSS, and may output the selected calibration signal as the impedance control signal IS. The selection circuit 520 may generate the impedance control signal IS by selecting one of the first to nth calibration signals CAL1, CAL2, . . . CALn on the basis of the impedance setting signal ZSS. The impedance control signal IS may include a pull-up impedance control signal ISP and a pull-down impedance control signal ISN. A pull-up calibration signal selected among the first to nth pull-up calibration signals PC1, PC2, . . . PCn may be provided as the pull-up impedance control signal ISP. A pull-down calibration signal selected among the first to nth pull-down calibration signals NC1, NC2, . . . NCn may be provided as the pull-down impedance control signal ISN.

The emphasis control circuit 550 may receive the impedance control signal IS from the selection circuit 520. The emphasis control circuit 550 may generate a plurality of emphasis signals which have different values, on the basis of the impedance control signal IS. The emphasis control circuit 550 may select at least one of the plurality of emphasis signals, and may output the selected emphasis signal as the emphasis control signal EMP. The emphasis control signal EMP may include a pull-up emphasis control signal EMPP and a pull-down emphasis control signal EMPN. The pull-up emphasis control signal EMPP and the pull-down emphasis control signal EMPN may be digital signals which have the same number of bits. In an embodiment, the emphasis control signal EMP may be an analog voltage signal. The emphasis control circuit 550 may generate a plurality of emphasis signals which have different values, and by using one of the plurality of emphasis signals, may variously adjust an emphasis driving force and/or strength by using one of the plurality of emphasis signals.

The data circuit 530 may be coupled to the selection circuit 520 and the emphasis control circuit 550, may receive the impedance control signal IS from the selection circuit 520, and may receive the emphasis control signal EMP from the emphasis control circuit 550. The data circuit 530 may set the impedance of the data circuit 530 on the basis of the impedance control signal IS and the emphasis control signal EMP. The data circuit 530 may set the pull-up impedance value of the data circuit 530 on the basis of the pull-up impedance control signal ISP and the pull-up emphasis control signal EMPP, and may set the pull-down impedance value of the data circuit 530 on the basis of the pull-down impedance control signal ISN and the pull-down emphasis control signal EMPN. The data circuit 530 may be coupled to the data pad 501, and may receive internal data DIN or output the internal data DIN. The data circuit 530 may drive the data pad 501 on the basis of the internal data DIN, and thereby, may output data corresponding to the internal data DIN through the data pad 501. The data circuit 530 may output data, received through the data pad 501, as the internal data DIN. During a read operation, the data circuit 530 may set the impedance of the data circuit 530 on the basis of the impedance control signal IS and the emphasis control signal EMP, and thereby, may adjust a driving force and/or strength for driving the data pad 501. During a write operation, the data circuit 530 may set the impedance of the data circuit 530 on the basis of the impedance control signal IS, and thereby, may set termination resistance for receiving data through the data pad 501. In an embodiment, even when the read and write operations are not performed, the data circuit 530 may set the impedance of the data circuit 530 on the basis of the impedance control signal IS. For example, when another semiconductor apparatus coupled to the external apparatus is provided together with the semiconductor apparatus 500, the data circuit 530 may provide termination resistance for write and read operations of the other semiconductor apparatus.

The semiconductor apparatus 500 may further include a setting control circuit 540. The setting control circuit 540 may receive a plurality of internal command signals, and may generate the impedance setting signal ZSS on the basis of the plurality of internal command signals. The plurality of internal command signals may be generated on the basis of command signals provided from the external apparatus coupled to the semiconductor apparatus 500. For example, the internal command signals may include a read signal RD for a read operation of the semiconductor apparatus 500, a write signal WT for a write operation of the semiconductor apparatus 500, and an internal termination signal IODT for non-target read and non-target write operations of the semiconductor apparatus 500. The setting control circuit 540 may store a plurality of impedance setting information. The setting control circuit 540 may be a mode register circuit. The setting control circuit 540 may select at least one of the plurality of impedance setting information on the basis of the read signal RD, the write signal WT and the internal termination signal IODT, and may output the selected impedance setting information as the impedance setting signal ZSS. The plurality of impedance setting information stored in the setting control circuit 540 and the impedance setting signal ZSS may be digital signals each including a plurality of bits.

Figure 6:
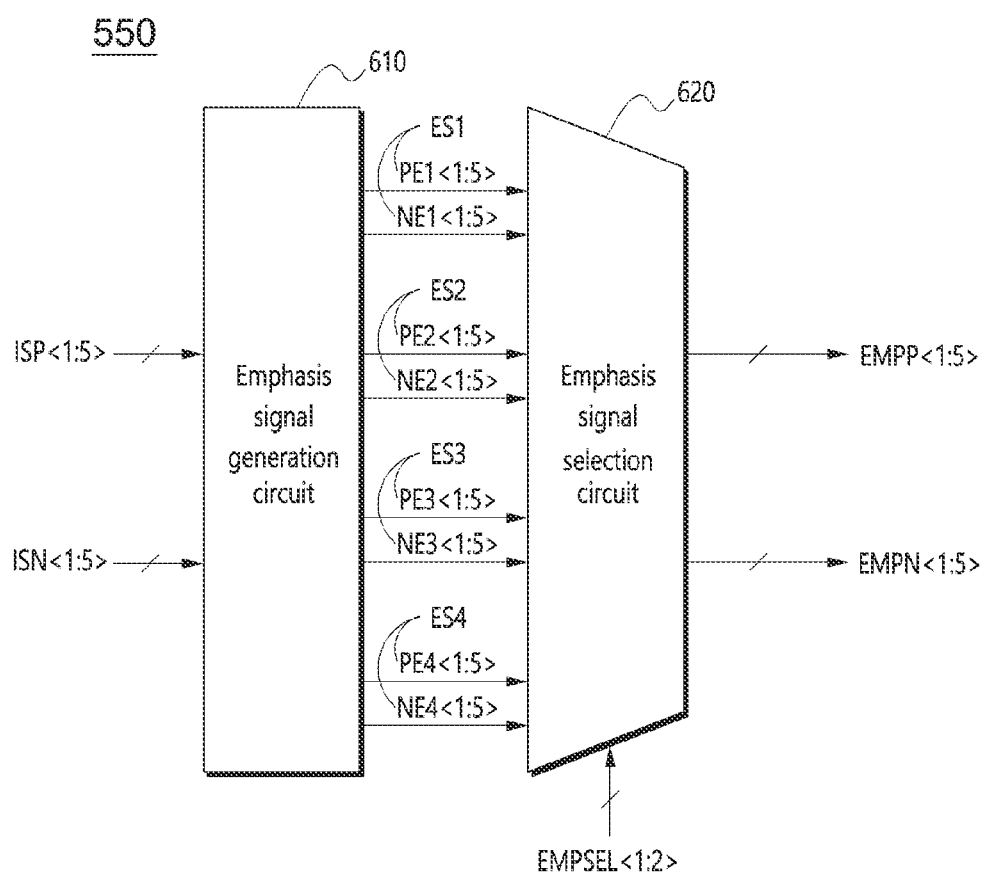
FIG. 6 is a diagram illustrating a configuration of an emphasis control circuit illustrated in FIG. 5.

FIG. 6 is a diagram illustrating the configuration of the emphasis control circuit 550 illustrated in FIG. 5. Referring to FIG. 6, the emphasis control circuit 550 may include an emphasis signal generation circuit 610 and an emphasis signal selection circuit 620, The emphasis signal generation circuit 610 may receive the impedance control signals ISP<1:5> and ISN<1:5>, and may generate a plurality of emphasis signals ES1, ES2, ES3, and ES4 on the basis of the impedance control signals ISP<1:5> and ISN<1:5>. While it is illustrated that each of the impedance control signals ISP<1:5> and ISN<1:5> and the plurality of emphasis signals ES1, ES2, ES3, and ES4 has five bits, the number of bits is not specifically limited. While four emphasis signals are illustrated, the number of emphasis signals may be less or more than four. The emphasis signal generation circuit 610 may generate first to fourth emphasis signals ES1, ES2, ES3, and ES4 from the impedance control signals ISP<1:5> and ISN<1:5>. Each of the first to fourth emphasis signals ES1, ES2, ES3, and ES4 may include a pull-up emphasis signal and a pull-down emphasis signal. The emphasis signal generation circuit 610 may generate a first pull-up emphasis signal PE1<1:5>, a second pull-up emphasis signal PE2<1:5>, a third pull-up emphasis signal PE3<1:5>, and a fourth pull-up emphasis signal PE4<1:5> from the pull-up impedance control signal ISP<1:5>. The emphasis signal generation circuit 610 may generate a first pull-down emphasis signal NE1<1:5>, a second pull-down emphasis signal NE2<1:5>, a third pull-down emphasis signal NE3<1:5>, and a fourth pull-down emphasis signal NE4<1:5> from the pull-down impedance control signal ISN<1:5>.

The first to fourth pull-up emphasis signals PE1<1:5>, PE2<1:5>, PE3<1:5>, and PE4<1:5> may have different values, and the first to fourth pull-down emphasis signals NE1<1:5>, NE2<1:5>, NE3<1:5>, and NE4<1:5> may have different values. For example, the emphasis signal generation circuit 610 may generate the first to fourth pull-up emphasis signals PE1<1:5>, PE2<1:5>, PE3<1:5>, and PE4<1:5> and the first to fourth pull-down emphasis signals NE1<1:5>, NE2<1:5>, NE3<1:5>, and NE4<1:5> by sequentially shifting the pull-up impedance control signal ISP<1:5> and the pull-down impedance control signal ISN<1:5>. The third to fifth bits PE1<3:5> and NE1<3:5> of the first pull-up emphasis signal and first pull-down emphasis signal PE1<1:5> and NE1<1:5> may be low logic levels. The first and second bits PE1<1:2> of the first pull-up emphasis signal PE1<1:5> may have logic levels corresponding to the fourth and fifth bits ISP<4:5> of the pull-up impedance control signal ISP<1:5>, and the first and second bits NE1<1:2> of the first pull-down emphasis signal NE1<1:5> may have logic levels corresponding to the fourth and fifth bits ISN<4:5> of the pull-down impedance control signal ISN<1:5>. The fourth and fifth bits PE2<4:5> and NE2<4:5> of the second pull-up emphasis signal and second pull-down emphasis signal PE2<1:5> and NE2<1:5> may be low logic levels. The first to third bits PE2<1:3> of the second pull-up emphasis signal PE2<1:5> may have logic levels corresponding to the third to fifth bits ISP<3:5> of the pull-up impedance control signal ISP<1:5>, and the first to third bits NE2<1:3> of the second pull-down emphasis signal NE2<1:5> may have logic levels corresponding to the third to fifth bits ISN<3:5> of the pull-down impedance control signal ISN<1:5>. The fifth bits PE3<5> and NE3<5> of the third pull-up emphasis signal and third pull-down emphasis signal PE3<1:5> and NE3<1:5> may be low logic levels. The first to fourth bits PE3<1:4> of the third pull-up emphasis signal PE3<1:5> may have logic levels corresponding to the second to fifth bits ISP<2:5> of the pull-up impedance control signal ISP<1:5>, and the first to fourth bits NE3<1:4> of the third pull-down emphasis signal NE3<1:5> may have logic levels corresponding to the second to fifth bits ISN<2:5> of the pull-down impedance control signal ISN<1:5>. The first to fifth bits PE4<1:5> of the fourth pull-up emphasis signal PE4<1:5> may have logic levels corresponding to the first to fifth bits ISP<1:5> of the pull-up impedance control signal ISP<1:5>, and the first to fifth bits NE4<1:5> of the fourth pull-down emphasis signal NE4<1:5> may have logic levels corresponding to the first to fifth bits ISN<1:5> of the pull-down impedance control signal ISN<1:5>.

The emphasis signal selection circuit 620 may receive the plurality of emphasis signals ES1, ES2, ES3, and ES4 and an emphasis selection signal EMPSEL<1:2>. The emphasis signal selection circuit 620 may select one of the plurality of emphasis signals ES1, ES2, ES3, and ES4 on the basis of the emphasis selection signal EMPSEL<1:2>, and may output the selected emphasis signal as the emphasis control signals EMPP<1:5> and EMPN<1:5>. The emphasis selection signal EMPSEL<1:2> may be a digital signal having two bits to select one of four emphasis signals. The emphasis selection signal EMPSEL<1:2> may be generated on the basis of a command signal provided from the external apparatus, or may be provided from the setting control circuit 540 illustrated in FIG. 5. The emphasis signal selection circuit 620 may select one of the plurality of emphasis signals ES1, ES2, ES3, and ES4 on the basis of the emphasis selection signal EMPSEL<1:2>, and may output the selected emphasis signal as the emphasis control signals EMPP<1:5> and EMPN<1:5>. For example, when both the first and second bits EMPSEL<1:2> of the emphasis selection signal EMPSEL<1:2> are low logic levels, the emphasis signal selection circuit 620 may provide the first pull-up emphasis signal PE1<1:5> as the pull-up emphasis control signal EMPP<1:5>, and may provide the first pull-down emphasis signal NE1<1:5> as the pull-down emphasis control signal EMPN<1:5>. When the first bit EMPSEL<1> of the emphasis selection signal EMPSEL<1:2> is a high logic level and the second bit EMPSEL<2> of the emphasis selection signal EMPSEL<1:2> is a low logic level, the emphasis signal selection circuit 620 may provide the second pull-up emphasis signal PE2<1:5> as the pull-up emphasis control signal EMPP<1:5>, and may provide the second pull-down emphasis signal NE2<1:5> as the pull-down emphasis control signal EMPN<1:5>. When the first bit EMPSEL<1> of the emphasis selection signal EMPSEL<1:2> is a low logic level and the second bit EMPSEL<2> of the emphasis selection signal EMPSEL<1:2> is a high logic level, the emphasis signal selection circuit 620 may provide the third pull-up emphasis signal PE3<1:5> as the pull-up emphasis control signal EMPP<1:5>, and may provide the third pull-down emphasis signal NE3<1:5> as the pull-down emphasis control signal EMPN<1:5>. When both the first and second bits EMPSEL<1:2> of the emphasis selection signal EMPSEL<1:2> are high logic levels, the emphasis signal selection circuit 620 may provide the fourth pull-up emphasis signal PE4<1:5> as the pull-up emphasis control signal EMPP<1:5>, and may provide the fourth pull-down emphasis signal NE4<1:5> as the pull-down emphasis control signal EMPN<1:5>.

Figure 7:
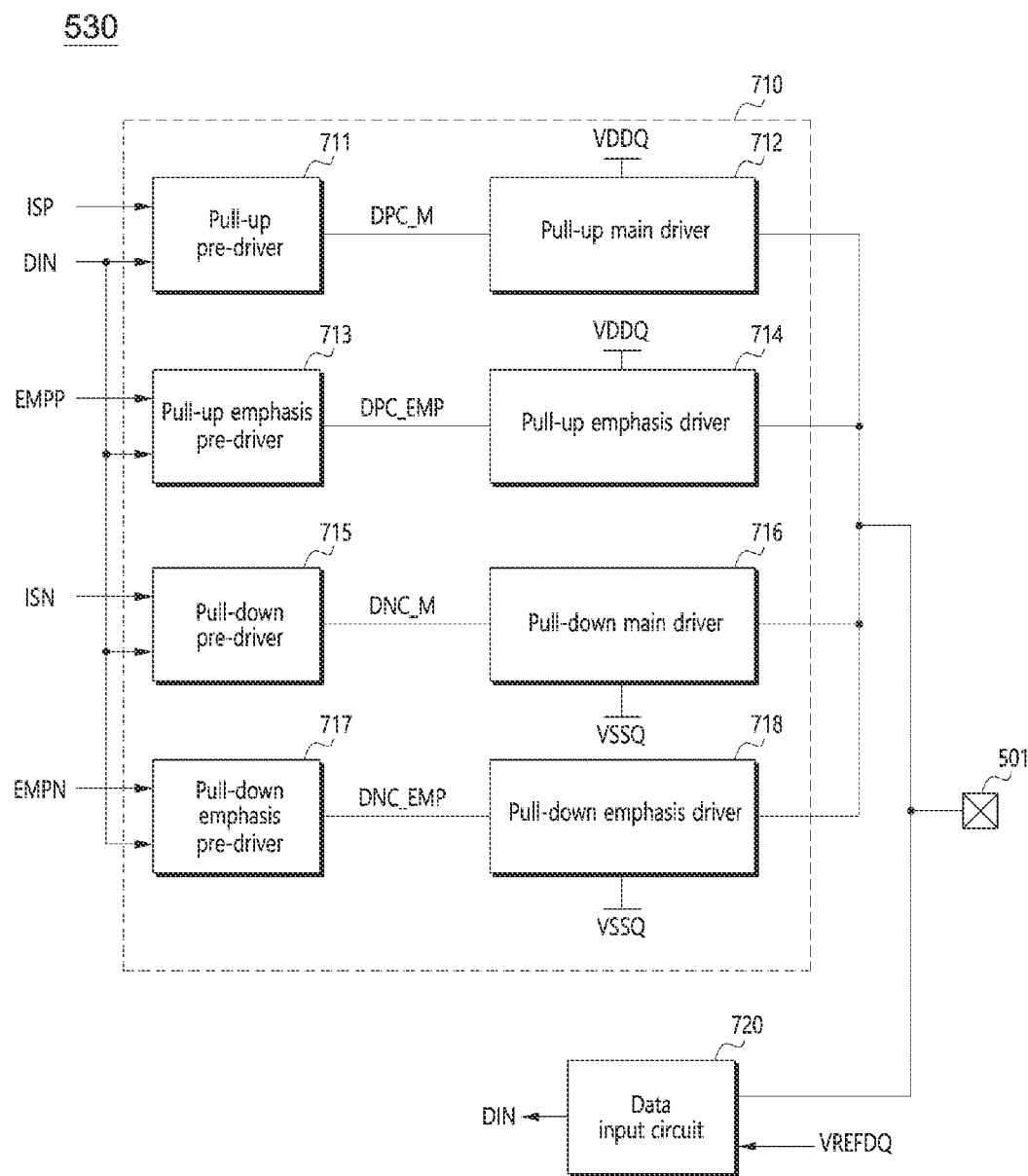
FIG. 7 is a diagram illustrating a configuration of a data circuit illustrated in FIG. 5.

FIG. 7 is a diagram illustrating the configuration of the data circuit 530 illustrated in FIG. 5. Referring to FIG. 7, the data circuit 530 may include a data output circuit 710 and a data input circuit 720. The data output circuit 710 and the data input circuit 720 may be coupled in common to a line through which internal data DIN is transmitted and the data pad 501. The data output circuit 710 may receive the impedance control signals ISP and ISN and the internal data DIN, and may drive the data pad 501 on the basis of the impedance control signals ISP and ISN, the emphasis control signals EMPP and EMPN and the internal data DIN. The data input circuit 720 may generate the internal data DIN from data received through the data pad 501. The data input circuit 720 may receive a data reference voltage VREFDQ. The data input circuit 720 may generate the internal data DIN by comparing data received through the data pad 501 with the data reference voltage VREFDQ.

The data output circuit 710 may include a pull-up pre-driver 711, a pull-up main driver 712, a pull-up emphasis pre-driver 713, a pull-up emphasis driver 714, a pull-down pre-driver 715, a pull-down main driver 716, a pull-down emphasis pre-driver 717, and a pull-down emphasis driver 718. The pull-up pre-driver 711 may receive the pull-up impedance control signal ISP and the internal data DIN. The pull-up pre-driver 711 may generate a pull-up main driving signal DPC_M on the basis of the pull-up impedance control signal ISP and the internal data DIN. The pull-up main driver 712 may be coupled to the pull-up pre-driver 711 and receive the pull-up main driving signal DPC_M from the pull-up pre-driver 711. The pull-up main driver 712 may be coupled between a terminal to which a first data power supply voltage VDDQ is supplied and the data pad 501, The pull-up main driver 712 may pull-up drive the data pad 501 on the basis of the pull-up main driving signal DPC_M.

The pull-up emphasis pre-driver 713 may receive the pull-up emphasis control signal EMPP and the internal data DIN. The pull-up emphasis pre-driver 713 may generate a pull-up emphasis driving signal DPC_EMP on the basis of the pull-up impedance control signal EMPP and the internal data DIN. The pull-up emphasis driver 714 may be coupled to the pull-up emphasis pre-driver 713 and receive the pull-up emphasis driving signal DPC_EMP from the pull-up emphasis pre-driver 713. The pull-up emphasis driver 714 may be coupled in parallel to the pull-up main driver 712 between a terminal to which the first data power supply voltage VDDQ is supplied and the data pad 501. The pull-up emphasis driver 714 may pull-up drive the data pad 501 on the basis of the pull-up emphasis driving signal DPC_EMP. The pull-up emphasis driver 714 may additionally pull-up drive the data pad 501 by assisting the pull-up main driver 712.

The pull-down pre-driver 715 may receive the pull-down impedance control signal ISN and the internal data DIN. The pull-down pre-driver 715 may generate a pull-down main driving signal DNC_M on the basis of the pull-down impedance control signal ISN and the internal data DIN. The pull-down main driver 716 may be coupled to the pull-down pre-driver 715 and receive the pull-down main driving signal DNC_M from the pull-down pre-driver 715. The pull-down main driver 716 may be coupled between the data pad 501 and a terminal to which a second data power supply voltage VSSQ is supplied. The pull-down main driver 716 may pull-down drive the data pad 501 on the basis of the pull-down main driving signal DNC_M.

The pull-down emphasis pre-driver 717 may receive the pull-down emphasis control signal EMPN and the internal data DIN. The pull-down emphasis pre-driver 717 may generate a pull-down emphasis driving signal DNC_EMP on the basis of the pull-down impedance control signal EMPN and the internal data DIN. The pull-down emphasis driver 718 may be coupled to the pull-down emphasis pre-driver 717 and receive the pull-down emphasis driving signal DNC_EMP from the pull-down emphasis pre-driver 717. The pull-down emphasis driver 718 may be coupled in parallel to the pull-down main driver 716 between the data pad 501 and a terminal to which the second data power supply voltage VSSQ is supplied. The pull-down emphasis driver 718 may pull-down drive the data pad 501 on the basis of the pull-down emphasis driving signal DNC_EMP. The pull-down emphasis driver 718 may additionally pull-down drive the data pad 501 by assisting the pull-down main driver 716.

Figure 8:
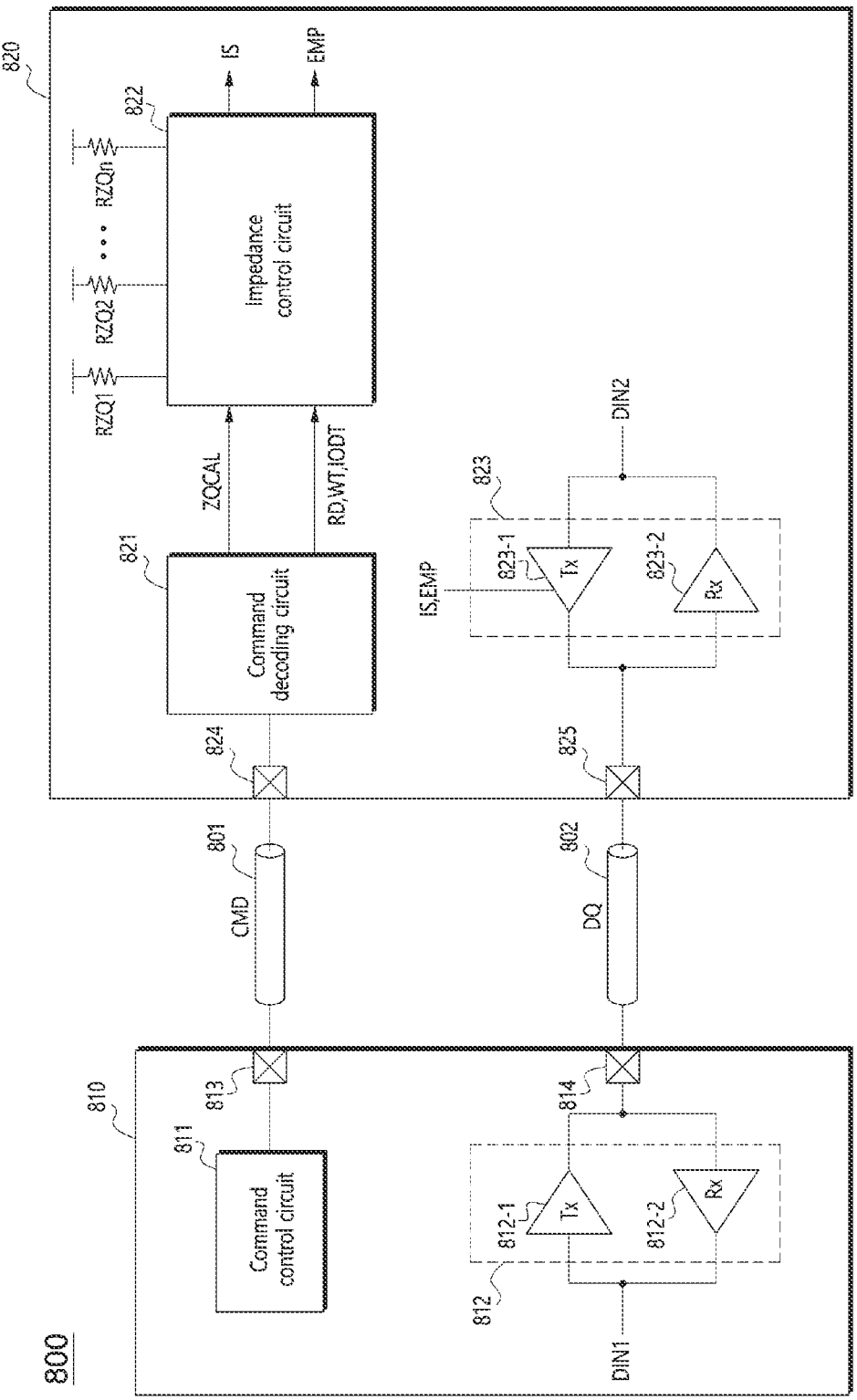
FIG. 8 is a diagram illustrating a configuration of a semiconductor system in accordance with an embodiment of the present disclosure.

FIG. 8 is a diagram illustrating the configuration of a semiconductor system 800 in accordance with an embodiment of the present disclosure. In FIG. 8, the semiconductor system 800 may include an external apparatus 810 and a semiconductor apparatus 820. The external apparatus 810 may provide various control signals which are necessary for the semiconductor apparatus 820 to operate. The external apparatus 810 may include various kinds of apparatuses. For example, the external apparatus 810 may be a host apparatus such as a central processing unit (CPU), a graphic processing unit (GPU), a multimedia processor (MMP), a digital signal processor, an application processor (AP), and a memory controller. The semiconductor apparatus 820 may be, for example, a memory apparatus, and the memory apparatus may include volatile memory or nonvolatile memory. Examples of volatile memory may include SRAM (static RAM), DRAM (dynamic RAM), and SDRAM (synchronous DRAM). Examples of nonvolatile memory may include ROM (read only memory), PROM (programmable ROM), EEPROM (electrically erasable and programmable ROM), EPROM (electrically programmable ROM), flash memory, PRAM (phase change RAM), MRAM (magnetic RAM), RRAM (resistive RAM), and FRAM (ferroelectric RAM).

The semiconductor apparatus 820 may be coupled to the external apparatus 810 through a plurality of buses. The plurality of buses may be signal transmission paths, links, or channels for transmitting signals. The plurality of buses may include a command bus 801 and a data bus 802. The command bus 801 may be a unidirectional bus, and the data bus 802 may be a bidirectional bus. The semiconductor apparatus 820 may receive a command signal CMD through the command bus 801 from the external apparatus 810. The command signal CMD may include a plurality of bits to include information on various operations to be performed by the semiconductor apparatus 820. The semiconductor apparatus 820 may be coupled to the external apparatus 810 through the data bus 802, and may receive data DQ from the external apparatus 810 or transmit data DQ to the external apparatus 810, through the data bus 802. Although not illustrated, the plurality of buses may further include a dock bus, an address bus, a strobe bus, and so forth. The dock bus and the address bus may be unidirectional buses, and the strobe bus may be a bidirectional bus. The semiconductor apparatus 820 may receive a dock signal through the dock bus from the external apparatus 810. The semiconductor apparatus 820 may receive the command signal CMD in synchronization with the clock signal. The semiconductor apparatus 820 may receive an address signal through the address bus from the external apparatus 810. When outputting the data DQ to the external apparatus 810 through the data bus 802, the semiconductor apparatus 820 may transmit a strobe signal, synchronized with the timing of the data DQ, to the external apparatus 810 through the strobe bus. When receiving the data DQ from the external apparatus 810 through the data bus 802, the semiconductor apparatus 820 may receive a strobe signal, synchronized with the timing of the data DQ, from the external apparatus 810.

The external apparatus 810 may include a command control circuit 811 and a data circuit 812. The command control circuit 811 may be coupled to the command bus 801 through a command pad 813. The command control circuit 811 may generate the command signal CMD, and may transmit the command signal CMD to the semiconductor apparatus 820 through the command bus 801. The command control circuit 811 may generate the command signal CMD, which may include various types of information, on the basis of a user's request and a feedback from the semiconductor apparatus 820. The command control circuit 811 may generate the command signal CMD which has a different logic value depending on an operation to be performed by the semiconductor apparatus 820.

The data circuit 812 may be coupled to the data bus 802 through a data pad 814. The data circuit 812 may drive the data pad 814 and the data bus 802 on the basis of internal data DIN1 of the external apparatus 810, and may transmit the data DQ corresponding to the internal data DIN1 to the semiconductor apparatus 820. The data circuit 812 may receive the data DQ, transmitted from the semiconductor apparatus 820, through the data bus 802, and may generate the internal data DIN1. The data circuit 812 may include a data output circuit 812-1 and a data input circuit 812-2. The data output circuit 812-1 may output the data DQ by driving the data pad 814 and the data bus 802 on the basis of the internal data DIN1. The data input circuit 812-2 may generate the internal data DIN1 from the data DQ transmitted through the data bus 802 and the data pad 814.

The semiconductor apparatus 820 may include a command decoding circuit 821, an impedance control circuit 822, and a data circuit 823. The command decoding circuit 821 may be coupled to the command bus 801 through a command pad 824, and may receive the command signal CMD transmitted through the command bus 801. The command decoding circuit 821 may latch the command signal CMD, and may generate a plurality of internal command signals by decoding the command signal CMD. The plurality of internal command signals may include a calibration command signal ZQCAL, a read signal RD, a write signal WT and an internal termination signal IODT. When the command signal CMD includes information instructing a calibration operation of the semiconductor apparatus 820, the command decoding circuit 821 may generate the calibration command signal ZQCAL by decoding the command signal CMD. When the command signal CMD includes information instructing a read operation of the semiconductor apparatus 820, the command decoding circuit 821 may generate the read signal RD by decoding the command signal CMD. When the command signal CMD includes information instructing a write operation of the semiconductor apparatus 820, the command decoding circuit 821 may generate the write signal WT by decoding the command signal CMD. When the command signal CMD includes information instructing a non-target read operation and a non-target write operation of the semiconductor apparatus 820, the command decoding circuit 821 may generate the internal termination signal IODT by decoding the command signal CMD. Although not illustrated, the command decoding circuit 821 may further generate internal command signals such as an active signal and a refresh signal on the basis of the command signal CMD.

The impedance control circuit 822 may be coupled to a plurality of reference resistors RZQ1, RZQ2, . . . RZQn which are included in the semiconductor apparatus 820, may provide an impedance control signal IS by receiving the calibration command signal ZQCAL and the internal command signals RD, WT and IODT. Here, n may be an arbitrary integer equal to or greater than 3. The impedance control circuit 822 may provide an emphasis control signal EMP together with the impedance control signal IS. The impedance control circuit 822 may include the calibration circuit 110, the selection circuit 120, and the setting control circuit 140 illustrated in FIG. 1, and may include the calibration circuit 510, the selection circuit 520, the emphasis control circuit 550, and the setting control circuit 540 illustrated in FIG. 5. The impedance control circuit 822 may generate a plurality of calibration signals by performing a calibration operation by being coupled to the plurality of reference resistors RZQ1, RZQ2, . . . RZQn on the basis of the calibration command signal ZQCAL. The impedance control circuit 822 may select at least one of the plurality of calibration signals on the basis of the internal command signals RD, WT, and IODT, and may output the selected calibration signal as the impedance control signal IS. The impedance control circuit 822 may generate a plurality of emphasis signals on the basis of the impedance control signal IS. The impedance control circuit 822 may select at least one of the plurality of emphasis signals, and may output the selected emphasis signal as the emphasis control signal EMP.

The data circuit 823 may be coupled to the data bus 802 through a data pad 825. The data circuit 823 may drive the data pad 825 and the data bus 802 on the basis of internal data DIN2 of the semiconductor apparatus 820, and may output the data DQ corresponding to the internal data DIN2 to the external apparatus 810. The data circuit 825 may receive the data DQ, transmitted from the external apparatus 810, through the data bus 802, and may generate the internal data DIN2. The data circuit 823 may include a data output circuit 823-1 and a data input circuit 823-2. The data output circuit 823-1 may output the data DQ by driving the data pad 825 and the data bus 802 on the basis of the internal data DIN2. The data output circuit 823-1 may receive the impedance control signal IS and the emphasis control signal EMP from the impedance control circuit 822. The data output circuit 823-1 may be set in the impedance value thereof on the basis of the impedance control signal IS, and the driving force and strength of the data output circuit 823-1 driving the data pad 825 and the data bus 802 may be determined on the basis of the impedance control signal IS, the emphasis control signal EMP and the internal data DIN2. The data input circuit 823-2 may generate the internal data DIN2 by comparing the data DQ received through the data bus 802 and the data pad 825 with a data reference voltage.

Figure 9:
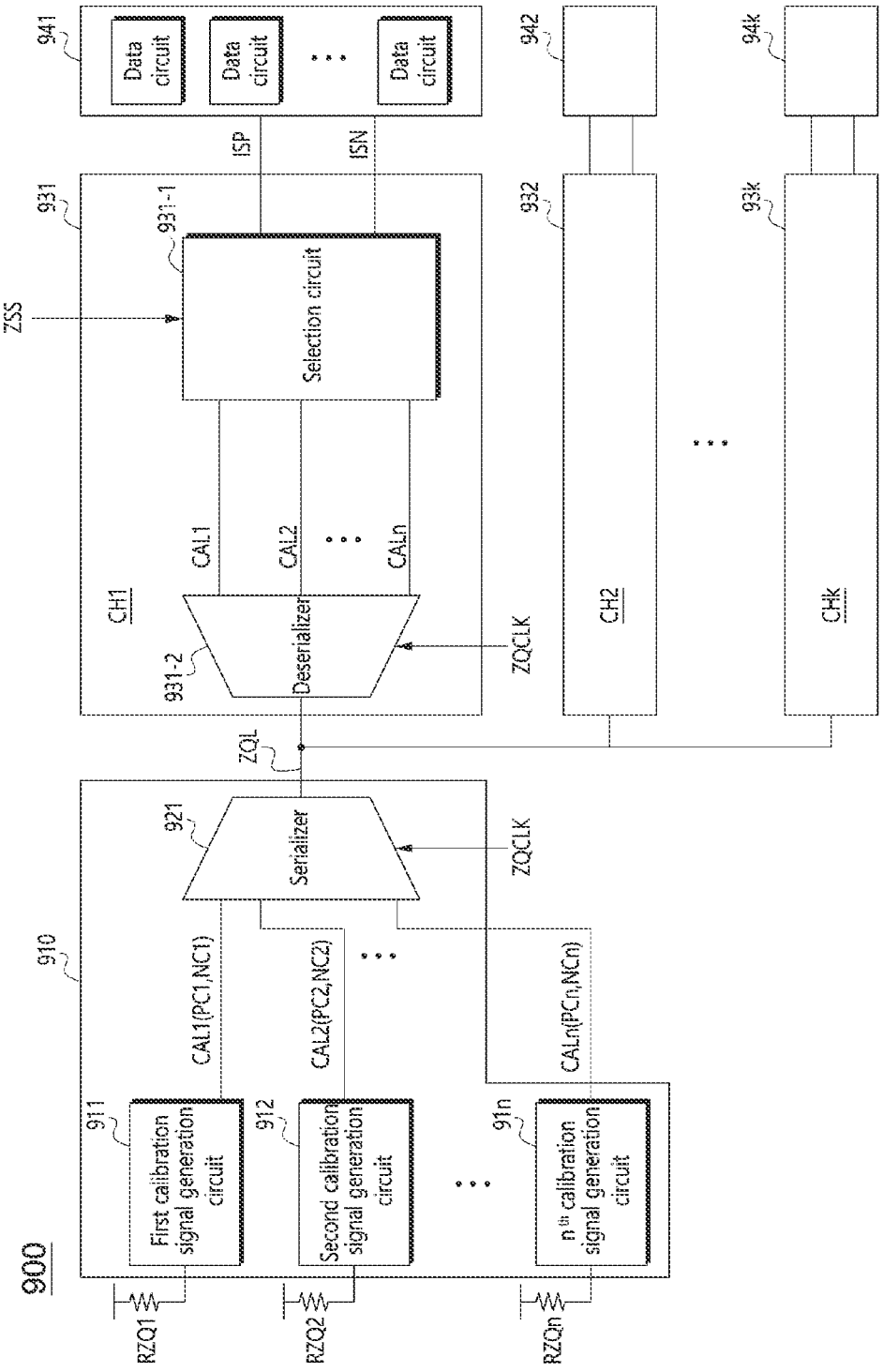
FIG. 9 is a diagram illustrating a configuration of a semiconductor apparatus in accordance with an embodiment of the present disclosure.

FIG. 9 is a diagram illustrating the configuration of a semiconductor apparatus 900 in accordance with an embodiment of the present disclosure. The configuration of the semiconductor apparatus 900 illustrated in FIG. 9 may be applied as the impedance control circuit 822 and the data circuit 823 of the semiconductor apparatus 820 illustrated in FIG. 8. Referring to FIG. 9, the semiconductor apparatus 900 may include a calibration circuit 910, a first channel control circuit 931, and a first channel data circuit 941. The calibration circuit 910 may include a plurality of calibration signal generation circuits 911, 912, 91n. A first calibration signal generation circuit 911 may be coupled to a first reference resistor RZQ1, and may generate a first calibration signal CAL1 by performing a calibration operation. The first calibration signal CAL1 may include a first pull-up calibration signal PC1 and a first pull-down calibration signal NC1. A second calibration signal generation circuit 912 may be coupled to a second reference resistor RZQ2, and may generate a second calibration signal CAL2 by performing a calibration operation. The second calibration signal CAL2 may include a second pull-up calibration signal PC2 and a second pull-down calibration signal NC2. An nth calibration signal generation circuit 91n may be coupled to an nth reference resistor RZQn, and may generate an nth calibration signal CALn by performing a calibration operation. The nth calibration signal CALn may include an nth pull-up calibration signal PCn and an nth pull-down calibration signal NCn.

The calibration circuit 910 may further include a serializer 921. The serializer 921 may receive a plurality of calibration signals CAL1, CAL2, . . . CALn outputted from the plurality of calibration signal generation circuits 911, 912, . . . 91n. The serializer 921 may receive the first to nth calibration signals CAL1, CAL2, CALn generated from the first to nth calibration signal generation circuits 911, 912, 91n and a calibration clock signal ZQCLK. The calibration dock signal ZQCLK may be generated from a dock signal which is received by the semiconductor apparatus 900 from an external apparatus, but is not limited thereto. The calibration clock signal ZQCLK may have a longer cycle than the clock signal. The serializer 921 may sequentially output the first to nth calibration signals CAL1, CAL2, . . . CALn to a calibration signal transmission line ZQL in synchronization with the calibration clock signal ZQCLK. By controlling the plurality of calibration signals CAL1, CAL2, . . . CALn to be sequentially transmitted, the serializer 921 may minimize or reduce the number of transmission lines for transmitting the plurality of calibration signals CAL1, CAL2, . . . CALn to the first channel control circuit 931.

The first channel control circuit 931 may receive the plurality of calibration signals CAL1, CAL2, . . . CALn from the calibration circuit 910, and may generate impedance control signals ISP and ISN from the plurality of calibration signals CAL1, CAL2, . . . CALn. The first channel control circuit 931 may further receive an impedance setting signal ZSS. The first channel control circuit 931 may select at least one of the plurality of calibration signals CAL1, CAL2, . . . CALn on the basis of the impedance setting signal ZSS, and may output the selected calibration signal as the impedance control signals ISP and ISN. The impedance control signals ISP and ISN may include a pull-up impedance control signal ISP and a pull-down impedance control signal ISN. The first channel control circuit 931 may provide the impedance control signals ISP and ISN to the first channel data circuit 941.

The first channel control circuit 931 may include a selection circuit 931-1. The selection circuit 931-1 may receive the plurality of calibration signals CAL1, CAL2, . . . CALn and the impedance setting signal ZSS. The selection circuit 931-1 may output at least one of the plurality of calibration signals CAL1, CAL2, . . . CALn as the impedance control signals ISP and ISN on the basis of the impedance setting signal ZSS. The first channel control circuit 931 may further include a deserializer 931-2. The deserializer 931-2 may be coupled to the calibration signal transmission line ZQL, and may receive the plurality of calibration signals CAL1, CAL2, . . . CALn transmitted through the calibration signal transmission line ZQL. The deserializer 931-2 may receive the calibration clock signal ZQCLK. The deserializer 931-2 may sequentially receive the calibration signals CAL1, CAL2, . . . CALn, transmitted through the calibration signal transmission line ZQL, in synchronization with the calibration clock signal ZQCLK.

The first channel data circuit 941 may include a plurality of data circuits. The plurality of data circuits may transmit a plurality of different internal data to the external apparatus of the semiconductor apparatus 900 or may generate the plurality of internal data by receiving data transmitted from the external apparatus of the semiconductor apparatus 900, Each of the data circuits 130 and 530 illustrated in FIGS. 1 and 5 may be applied as the plurality of data circuits. The plurality of data circuits may receive the impedance control signals ISP and ISN from the first channel control circuit 931. The plurality of data circuits may be set in the impedances thereof on the basis of the impedance control signals ISP and ISN. For example, the pull-up impedances of the plurality of data circuits may be set on the basis of the pull-up impedance control signal ISP and the pull-down impedances of the plurality of data circuits may be set on the basis of the pull-down impedance control signal ISN.

The semiconductor apparatus 900 may further include second to kth channel control circuits 932 to 93k and second to kth channel data circuits 942 to 94k. Here, k may be an arbitrary integer equal to or greater than 3. The second to kth channel control circuits 932 to 93k may be coupled in common to the calibration signal transmission line ZQL together with the first channel control circuit 931, and may receive in common the plurality of calibration signals CAL1, CAL2, . . . CALn outputted from the calibration circuit 910. Each of the second to kth channel control circuits 932 to 93k may include substantially the same configuration as the first channel control circuit 931, and may perform substantially the same function as the first channel control circuit 931. Each of the second to kth channel data circuits 942 to 94k may include the same number of data circuits as the first channel data circuit 941. Each of the first to kth channel data circuits 941, 942, . . . 94k may be coupled to a data bus which configures an independent channel.

FIG. 10 is a diagram illustrating the configuration of a semiconductor apparatus 1000 in accordance with an embodiment of the present disclosure. The semiconductor apparatus 1000 may be a stack semiconductor apparatus in which a plurality of chips and/or dies are stacked. Referring to FIG. 10, the semiconductor apparatus 1000 may include a base chip 1010 and a plurality of core chips 1021, 1022, . . . 102k. Here, k may be an arbitrary integer equal to or greater than 3. The number of the plurality of core chips may be 4, 8, 16, or more. The base chip 1010 may be disposed below, and a first core chip 1021, a second core chip 1022, . . . , and a kth core chip 102k may be sequentially stacked on the base chip 1010. The base chip 1010 may function as a master chip of the semiconductor apparatus 1000, and may serve as an interface chip which communicates with an external apparatus of the semiconductor apparatus 1000. The plurality of core chips 1021, 1022, . . . 102k may function as slave chips, and by communicating with the base chip 1010, may store data transmitted from the base chip 1010 or output stored data to the base chip 1010. The base chip 1010 and the plurality of core chips 1021, 1022, ... 102k may be electrically coupled through through electrodes 1001 such as through-silicon vias (TSVs). Data received from the external apparatus may be provided from the base chip 1010 to the plurality of core chips 1021, 1022, ... 102k through the through electrodes 1001, and data outputted from the plurality of core chips 1021, 1022, ... 102k may be transmitted to the base chip 1010 and the external apparatus through the through electrodes 1001. Bumps 1002 may be disposed to couple the through electrodes 1001 of the base chip 1010 and the plurality of core chips 1021, 1022, ... 102k. Each bump 1002 may be a micro bump. Each of the plurality of core chips 1021, 1022, ... 102k may form an independent channel. For example, the first core chip 1021 may form a first channel, the second core chip 1022 may form a second channel, and the kth core chip 102k may form a kth channel. In an embodiment, each of the first to kth core chips 1021, 1022, ... 102k may form two channels. For example, the first core chip 1021 may form first and second channels, the second core chip 1022 may form third and fourth channels, and the kth core chip 102k may form (2k-1)th and 2kth channels.

The base chip 1010 may include a calibration circuit 1011, a channel control circuit 1012 and a channel data circuit 1013. The semiconductor apparatus 900 illustrated in FIG. 9 may be applied as the configuration of the base chip 1010. For example, the channel control circuit 1012 may include the first to kth channel control circuits 931, 932, ... 93k, and the channel data circuit 1013 may include the first to kth channel data circuits 941, 942, ... 94k. Each of the first to kth channel data circuits of the channel data circuit 1013 may include a plurality of data circuits. The plurality of data circuits may be coupled to different through electrodes, respectively. The plurality of data circuits may be coupled to the external apparatus through the through electrodes 1001 and the bumps 1002 which are coupled to the bottom of the base chip 1010. The plurality of data circuits may output data of the first to kth channels to the external apparatus or receive data of the first to kth channels transmitted from the external apparatus. The first channel data circuit may transmit first channel data to the first core chip 1021 or receive first channel data outputted from the first core chip 1021, through the through electrodes 1001. The second channel data circuit may transmit second channel data to the second core chip 1022 or receive second channel data outputted from the second core chip 1022, through the through electrodes 1001. The kth channel data circuit may transmit kth channel data to the kth core chip 102k or receive kth channel data outputted from the kth core chip 102k, through the through electrodes 1001.

The calibration circuit 1011 may be coupled to a plurality of reference resistors RZQ1, RZQ2, ... RZQn, and may generate a plurality of calibration signals CAL1, CAL2, ... CALn. The channel control circuit 1012 may receive the plurality of calibration signals CAL1, CAL2, ... CALn generated from the calibration circuit 1011. The channel control circuit 1012 may generate impedance control signals IS1, IS2, ... ISk and emphasis control signals EMP1, EMP2, ... EMPk from the plurality of calibration signals CAL1, CAL2, ... CALn according to impedance setting signals ZSS1, ZSS2, ... ZSSk of the respective channels. The impedance setting signals ZSS1, ZSS2, ... ZSSk of the respective channels may have the same value, or at least any one may have a different value. According to the impedance setting signals ZSS1, ZSS2, ... ZSSk of the respective channels, the impedance control signals IS1, IS2, ... ISk and the emphasis control signals EMP1, EMP2, ... EMPk of the respective channels may have the same values, or at least any one may have a different value. For example, the channel control circuit 1012 may generate the impedance control signal IS1 and the emphasis control signal EMP1 of the first channel by selecting one of the plurality of calibration signals CAL1, CAL2, ... CALn according to the impedance setting signal ZSS1 of the first channel. The first channel data circuit of the channel data circuit 1013 may set an impedance on the basis of the impedance control signal IS1 of the first channel, and may adjust a driving force and a strength with which the first channel data is outputted, on the basis of the impedance control signal IS1 and the emphasis control signal EMP1 of the first channel. The channel control circuit 1012 may generate the impedance control signal IS2 and the emphasis control signal EMP2 of the second channel by selecting one of the plurality of calibration signals CAL1, CAL2, ... CALn according to the impedance setting signal ZSS2 of the second channel. The second channel data circuit of the channel data circuit 1013 may set an impedance on the basis of the impedance control signal IS2 of the second channel, and may adjust a driving force and a strength with which the second channel data is outputted, on the basis of the impedance control signal IS2 and the emphasis control signal EMP2 of the second channel. The channel control circuit 1012 may generate the impedance control signal ISk and the emphasis control signal EMPk of the kth channel by selecting one of the plurality of calibration signals CAL1, CAL2, ... CALn according to the impedance setting signal ZSSk of the kth channel. The kth channel data circuit of the channel data circuit 1013 may set an impedance on the basis of the impedance control signal ISk of the kth channel, and may adjust a driving force and a strength with which the kth channel data is outputted, on the basis of the impedance control signal ISk and the emphasis control signal EMPk of the kth channel.

The first to kth core chips 1021, 1022, ... 102k may include the same configuration. The first core chip 1021 may include a data storage region 1021-1 and a data input/output circuit 1021-2. A plurality of word lines and a plurality of bit lines (not illustrated) may be disposed in the data storage region 1021-1, and the data storage region 1021-1 may include a plurality of memory cells (not illustrated) which are coupled between the plurality of word lines and the plurality of bit lines. The plurality of memory cells may be volatile memory cells or nonvolatile memory cells. The data storage region 1021-1 may store data of the first core chip 1021. The data storage region 1021-1 may further include a write circuit and a read circuit (not illustrated) for storing the first channel data in the plurality of memory cells or outputting the first channel data stored in the plurality of memory cells. The data input/output circuit 1021-2 may be coupled between the data storage region 1021-1 and the through electrodes 1001. The data input/output circuit 1021-2 may provide the first channel data, transmitted from the base chip 1010 through the through electrodes 1001, to the data storage region 1021-1. The data input/output circuit 1021-2 may receive the first channel data outputted from the data storage region 1021-1, and may transmit the first channel data to the base chip 1010 through the through electrodes 1001. The second core chip 1022 may include a data storage region 1022-1 and a data input/output circuit 1022-2. The data input/output circuit 1022-2 may be coupled between the data storage region 1022-1 and the through electrodes 1001. The data input/output circuit 1022-2 may provide the second channel data, transmitted from the base chip 1010 through the through electrodes 1001, to the data storage region 1022-1. The data input/output circuit 1022-2 may receive the second channel data outputted from the data storage region 1022-1, and may transmit the second channel data to the base chip 1010 through the through electrodes 1001. The kth core chip 102k may include a data storage region 102k-1 and a data input/output circuit 102k-2. The data input/output circuit 102k-2 may be coupled between the data storage region 102k-1 and the through electrodes 1001. The data input/output circuit 102k-2 may provide the kth channel data, transmitted from the base chip 1010 through the through electrodes 1001, to the data storage region 102k-1. The data input/output circuit 102k-2 may receive the kth channel data outputted from the data storage region 102k-1, and may transmit the kth channel data to the base chip 1010 through the through electrodes 1001.

While various embodiments have been described above, it will be understood to those skilled in the art that the embodiments described are examples only. Accordingly, the semiconductor apparatus including a calibration circuit described herein should not be limited based on the described embodiments.

What is claimed is:

1. A semiconductor apparatus comprising:
    a first reference resistor and a second reference resistor having different resistance values from each other;
    a calibration circuit configured to generate a first calibration signal by being coupled to the first reference resistor and performing a calibration operation, and generate a second calibration signal by being coupled to the second reference resistor and performing a calibration operation;
    a selection circuit configured to generate an impedance control signal by selecting one of the first and second calibration signals based on an impedance setting signal; and
    a data circuit configured to set an impedance based on the impedance control signal.

2. The semiconductor apparatus according to claim 1 wherein the calibration circuit comprises:
    a first calibration signal generation circuit configured to generate the first calibration signal by being coupled to the first reference resistor and performing the calibration operation; and
    a second calibration signal generation circuit configured to generate the second calibration signal by being coupled to the second reference resistor and performing the calibration operation.

3. The semiconductor apparatus according to claim 2, wherein the first calibration signal comprises a first pull-up calibration signal and a first pull-down calibration signal, and
    wherein the first calibration signal generation circuit comprises:
    a reference resistance leg coupled between a terminal to which a first power supply voltage is supplied and a pull-up calibration node, the reference resistance leg configured to receive the first pull-up calibration signal;
    a first comparator configured to compare a voltage level of the pull-up calibration node and a level of a reference voltage;
    a pull-up signal generator configured to generate the first pull-up calibration signal based on an output of the first comparator;
    a pull-up resistance leg coupled between the terminal to which the first power supply voltage is supplied and a pull-down calibration node, and configured to receive the first pull-up calibration signal;
    a pull-down resistance leg coupled between the pull-down calibration node and a terminal to which a second power supply voltage is supplied, the pull-down resistance leg configured to receive the first pull-down calibration signal;
    a second comparator configured to compare a voltage level of the pull-down calibration node and the level of the reference voltage; and
    a pull-down signal generator configured to generate the first pull-down calibration signal based on an output of the second comparator.

4. The semiconductor apparatus according to claim 1, wherein the data circuit comprises:
    a data output circuit configured to set the impedance based on the impedance control signal and internal data, and drive a data pad; and
    a data input circuit configured to output data received through the data pad as internal data.

5. The semiconductor apparatus according to claim 4, wherein the impedance control signal comprises a pull-up impedance control signal and a pull-down impedance control signal, and
    wherein the data output circuit comprises:
    a pull-up pre-driver configured to generate a pull-up driving signal based on the pull-up impedance control signal and the internal data;
    a pull-up driver configured to pull-up drive the data pad based on the pull-up driving signal;
    a pull-down pre-driver configured to generate a pull-down driving signal based on the pull-down impedance control signal and the internal data; and
    a pull-down driver configured to pull-down drive the data pad based on the pull-down driving signal.

6. A semiconductor apparatus comprising:
    a calibration circuit configured to generate a first calibration signal by being coupled to a first reference resistor and performing a calibration operation, and generate a second calibration signal by being coupled to a second reference resistor which has a resistance value different from that of the first reference resistor and performing a calibration operation;
    a selection circuit configured to generate an impedance control signal by selecting one of the first and second calibration signals based on an impedance setting signal;
    an emphasis control circuit configured to generate an emphasis control signal based on the impedance control signal and an emphasis selection signal; and
    a data circuit configured to set an impedance based on the impedance control signal and the emphasis control signal.

7. The semiconductor apparatus according to claim 6, wherein the calibration circuit comprises:
    a first calibration signal generation circuit configured to generate the first calibration signal by being coupled to the first reference resistor and performing the calibration operation; and
    a second calibration signal generation circuit configured to generate the second calibration signal by being coupled to the second reference resistor and performing the calibration operation.

8. The semiconductor apparatus according to claim 7, wherein the first calibration signal comprises a first pull-up calibration signal and a first pull-down calibration signal, and wherein the first calibration signal generation circuit comprises:
a reference resistance leg coupled between a terminal to which a first power supply voltage is supplied and a pull-up calibration node, the reference resistance leg configured to receive the first pull-up calibration signal;
a first comparator configured to compare a voltage level of the pull-up calibration node and a level of a reference voltage;
a pull-up signal generator configured to generate the first pull-up calibration signal based on an output of the first comparator;
a pull-up resistance leg coupled between the terminal to which the first power supply voltage is supplied and a pull-down calibration node, the pull-up resistance leg configured to receive the first pull-up calibration signal;
a pull-down resistance leg coupled between the pull-down calibration node and a terminal to which a second power supply voltage is supplied, the pull-down resistance leg configured to receive the first pull-down calibration signal;
a second comparator configured to compare a voltage level of the pull-down calibration node and the level of the reference voltage; and
a pull-down signal generator configured to generate the first pull-down calibration signal based on an output of the second comparator.

9. The semiconductor apparatus according to claim 6, wherein the impedance control signal comprises a pull-up impedance control signal and a pull-down impedance control signal, and the emphasis control signal comprises a pull-up emphasis control signal and a pull-down emphasis control signal, and
wherein the emphasis control circuit comprises:
an emphasis signal generation circuit configured to generate a plurality of pull-up emphasis signals which have different values, based on the pull-up impedance control signal, and generate a plurality of pull-down emphasis signals which have different values, based on the pull-down impedance control signal; and
an emphasis signal selection circuit configured to, based on the emphasis selection signal, output one of the plurality of pull-up emphasis signals as the pull-up emphasis control signal and output one of the plurality of pull-down emphasis signals as the pull-down emphasis control signal.

10. The semiconductor apparatus according to claim 6, wherein the data circuit comprises:
a data output circuit configured to set the impedance based on the impedance control signal, the emphasis control signal, and internal data, and drive a data pad; and
a data input circuit configured to output data received through the data pad, as the internal data.

11. The semiconductor apparatus according to claim 10, wherein the impedance control signal comprises a pull-up impedance control signal and a pull-down impedance control signal, and the emphasis control signal comprises a pull-up emphasis control signal and a pull-down emphasis control signal, and
wherein the data output circuit comprises:
a pull-up pre-driver configured to generate a pull-up main driving signal based on the pull-up impedance control signal and the internal data;
a pull-up main driver configured to pull-up drive the data pad based on the pull-up main driving signal;
a pull-up emphasis pre-driver configured to generate a pull-up emphasis driving signal based on the pull-up emphasis control signal;
a pull-up emphasis driver configured to pull-up drive the data pad based on the pull-up emphasis driving signal;
a pull-down pre-driver configured to generate a pull-down main driving signal based on the pull-down impedance control signal and the internal data;
a pull-down main driver configured to pull-down drive the data pad based on the pull-down main driving signal;
a pull-down emphasis pre-driver configured to generate a pull-down emphasis driving signal based on the pull-down emphasis control signal; and
a pull-down emphasis driver configured to pull-down drive the data pad based on the pull-down emphasis driving signal.

12. A semiconductor apparatus comprising:
a calibration circuit configured to perform calibration operations by being coupled to each of a plurality of reference resistors having different values, and generate a plurality of pull-up calibration signals and a plurality of pull-down calibration signals;
a selection circuit configured to, based on an impedance setting to signal, provide one signal among the plurality of pull-up calibration signals as a pull-up impedance control signal and provide one signal among the plurality of pull-down calibration signals as a pull-down impedance control signal; and
a data circuit configured to set an impedance based on the pull-up impedance control signal and the pull-down impedance control signal.

13. The semiconductor apparatus according to claim 12, wherein the data circuit comprises:
a data output circuit configured to pull-up drive a data pad based on the pull-up impedance control signal and internal data, and pull-down drive the data pad based on the pull-down impedance control signal and the internal data; and
a data input circuit configured to output data received through the data pad as internal data.

14. The semiconductor apparatus according to claim 12, further comprising an emphasis control circuit configured to:
generate a pull-up emphasis control signal based on the pull-up impedance control signal; and
generate a pull-down emphasis control signal based on the pull-down impedance control signal.

15. The semiconductor apparatus according to claim 14, wherein the emphasis control circuit comprises:
an emphasis signal generation circuit configured to generate a plurality of pull-up emphasis signals which have different values, based on the pull-up impedance control signal, and generate a plurality of pull-down emphasis signals which have different values, based on the pull-down impedance control signal; and
an emphasis signal selection circuit configured to, based on an emphasis selection signal, provide one of the plurality of pull-up emphasis signals as the pull-up emphasis control signal and provide one of the plurality of pull-down emphasis signals as the pull-down emphasis control signal.

16. The semiconductor apparatus according to claim 14, wherein the data circuit is configured to set the impedance by further receiving the pull-up emphasis control signal and the pull-down emphasis control signal.

17. A semiconductor apparatus comprising:
a calibration circuit configured to generate a plurality of calibration signals by being coupled to a plurality of reference resistors which have different resistance values and performing calibration operations;

a first channel control circuit configured to receive the plurality of calibration signals, and generate an impedance control signal of a first channel by selecting one signal among the plurality of calibration signals based on an impedance setting signal of the first channel; and a first channel data circuit including a plurality of data circuits each of which sets an impedance based on the impedance control signal of the first channel.

18. The semiconductor apparatus according to claim 17, wherein the calibration circuit comprises:

a plurality of calibration signal generation circuits configured to generate the plurality of calibration signals, respectively, by being coupled one to one to the plurality of reference resistors; and a serializer configured to sequentially transmit the plurality of calibration signals in synchronization with a clock signal.

19. The semiconductor apparatus according to claim 17, wherein the first channel control circuit comprises:

a deserializer configured to receive the plurality of calibration signals, transmitted from the calibration circuit, in synchronization with the dock signal; and a selection circuit configured to select one signal among the plurality of calibration signals based on the impedance setting signal of the first channel, and output the selected calibration signal as the impedance control signal.

20. The semiconductor apparatus according to claim 17, wherein the plurality of data circuits are coupled to different data pads, respectively.

21. The semiconductor apparatus according to claim 17, further comprising:

a second channel control circuit configured to receive the plurality of calibration signals, and output an impedance control signal of a second channel by selecting one signal among the plurality of calibration signals based on an impedance setting signal of the second channel; and a second channel data circuit including a plurality of data circuits each of which sets an impedance based on the impedance control signal of the second channel.

* * * * *

UNITED STATES PATENT AND TRADEMARK OFFICE
CERTIFICATE OF CORRECTION

PATENT NO. : 11,792,052 B2
APPLICATION NO. : 17/585308
DATED : October 17, 2023
INVENTOR(S) : Jung Hyun Shin and Yongsuk Choi It is certified that error appears in the above-identified patent and that said Letters Patent is hereby corrected as shown below:

In the Claims

Column 23, Line 40. Please replace:
"2. The semiconductor apparatus according to claim wherein the calibration circuit comprises:
a first calibration signal generation circuit configured to generate the first calibration signal by being coupled to the first reference resistor and performing the calibration operation; and
a second calibration signal generation circuit configured to generate the second calibration signal by being coupled to the second reference resistor and performing the calibration operation."

With:
--2. The semiconductor apparatus according to claim 1, wherein the calibration circuit comprises:
a first calibration signal generation circuit configured to generate the first calibration signal by being coupled to the first reference resistor and performing the calibration operation; and
a second calibration signal generation circuit configured to generate the second calibration signal by being coupled to the second reference resistor and performing the calibration operation.--

Signed and Sealed this
Twenty-eighth Day of May, 2024

Katherine Kelly Vidal
*Director of the United States Patent and Trademark Office*